(12) United States Patent
Lee et al.

(10) Patent No.: US 10,716,221 B2
(45) Date of Patent: Jul. 14, 2020

(54) METHOD OF MANUFACTURING ELECTRONIC DEVICE

(71) Applicant: SAMSUNG DISPLAY CO., LTD., Yongin-si, Gyeonggi-do (KR)

(72) Inventors: Jun-hee Lee, Seoul (KR); Sang-hoon Back, Asan-si (KR); Daeho Yang, Asan-si (KR); Seungjoo Lee, Seongnam-si (KR); Myung-gil Choi, Yongin-si (KR); Taeyoung Park, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 287 days.

(21) Appl. No.: 15/449,697

(22) Filed: Mar. 3, 2017

(65) Prior Publication Data
US 2017/0257953 A1 Sep. 7, 2017

(30) Foreign Application Priority Data

Mar. 4, 2016 (KR) .......... 10-2016-0026223
Sep. 9, 2016 (KR) .......... 10-2016-0116785

(51) Int. Cl.
*H05K 3/36* (2006.01)
*G02F 1/1345* (2006.01)
*H05K 1/14* (2006.01)
*H05K 13/00* (2006.01)

(52) U.S. Cl.
CPC ......... *H05K 3/361* (2013.01); *G02F 1/13452* (2013.01); *H05K 1/147* (2013.01); *H05K 13/0015* (2013.01); *H05K 2201/052* (2013.01); *H05K 2201/10128* (2013.01); *H05K 2203/0195* (2013.01); *H05K 2203/082* (2013.01)

(58) Field of Classification Search
CPC ...... G02F 1/13452; H05K 1/147; H05K 3/36; H05K 3/361; H05K 13/0015
See application file for complete search history.

(56) References Cited

U.S. PATENT DOCUMENTS

2008/0045077 A1* 2/2008 Chou ................. H01R 4/027
439/495
2015/0208505 A1* 7/2015 Shen ................. H05K 3/363
174/254

FOREIGN PATENT DOCUMENTS

| KR | 10-2013-0069989 | 6/2013 |
| KR | 10-1305920 | 9/2013 |
| KR | 10-2014-0046267 | 4/2014 |
| KR | 10-1416582 B1 * | 7/2014 |

* cited by examiner

*Primary Examiner* — Paul D Kim
(74) *Attorney, Agent, or Firm* — Lewis Roca Rothgerber Christie LLP

(57) ABSTRACT

Provided is a method for manufacturing an electronic device. The method includes providing a panel to a stage, providing a circuit board, aligning the circuit board so that first pads of the circuit board face a first pad area of the panel and second pads of the circuit board face a second pad area of the panel, and compressing a first portion of the circuit board on which the first pads are arranged to the first pad area of the panel. The aligning of the circuit board occurs via by external contact on one surface of the first portion of the circuit board and one surface of the second portion of the circuit board.

12 Claims, 23 Drawing Sheets

METHOD OF MANUFACTURING ELECTRONIC DEVICE

CROSS-REFERENCE TO RELATED APPLICATIONS

This patent application claims priority to and the benefit of Korean Patent Application Nos. 10-2016-0026223 and 10-2016-0116785, filed on Mar. 4, 2016 and Sep. 9, 2016, respectively, in the Korean Intellectual Property Office, the entire contents of which are hereby incorporated by reference.

BACKGROUND

1. Field

Aspects of embodiments of the present invention relate to a method of manufacturing an electronic device and equipment for manufacturing the same.

2. Description of the Related Art

An electronic device generally includes a plurality of circuit wirings and a plurality of electronic elements connected thereto and is operated by receiving an electric signal (e.g., is operated according to a received electric signal). The electronic device may, for example, receive an electric signal to display an image or detect a touch.

An electronic device also generally includes a panel and a driving part (e.g., a driver) for driving the same. The driving part may be separately provided and connected to the panel through a flexible circuit board or may be provided on a circuit board and directly connected to the panel.

SUMMARY

Embodiments of the present invention provide electronic device manufacturing equipment capable of stably coupling a circuit board to a plurality of pad areas defined on different surfaces of a panel.

Embodiments of the present invention also provide an electronic device manufacturing method including aligning a panel to a circuit board with improved accuracy and stably maintaining coupling therebetween during a manufacturing process.

An embodiment of the present invention provides a method for manufacturing an electronic device including a panel and a circuit board. The panel has an active area, a first pad area adjacent to the active area, and a second pad area adjacent to the active area. The circuit board includes a main portion, a first portion connected to the main portion and including first pads on one side of the circuit board, a second portion connected to the main portion, spaced from the first portion on a plane, and including second pads on another side of the circuit board. The method includes: providing the panel to a stage; providing the circuit board; and compressing the first portion of the circuit board to the first pad area of the panel. The aligning of the circuit board includes moving the first portion to be on (or over) one side of the panel by adhering to the one surface thereof and moving the second portion to be on (or under) another side of the panel by adhering to the one surface thereof.

The aligning of the circuit board may further include moving the stage horizontally to move the panel.

The circuit board may further include a third portion spaced from the second portion with the first portion therebetween. The third portion may include third pads on the other side of the circuit board and separate from the first pads and the second pads, and the circuit board may be aligned by external contact occurring concurrently on the one surface of the first portion, the one surface of the second portion, and one surface of the third portion.

The panel may further include a third pad area adjacent to the active area and separate from the first pad area and the second pad area, and the aligning of the circuit board may further include the third portion being arranged on the other side of the panel.

The method may further include: reversing the panel; aligning the second portion of the circuit board; and compressing the second portion of the circuit board to the second pad area of the panel. The reversing of the panel may include rotating the panel about 180° with respect to a rotational axis such that the second pad area faces upward, and the rotational axis may have an extension direction crossing a direction along which the first pad area and the second pad area are arranged.

The stage may move the panel in a direction parallel to the extension direction of the rotational axis.

The second portion may be aligned by being vertically and horizontally moved by using a clamp.

The compressing of the second portion to the second pad area may be performed in a state in which the second portion is fixed by the clamp.

The second portion may be aligned in a state in which the first portion is attached to the first pad area.

The compressing of the first portion to the first pad area may include: performing temporary compression on the first portion; and performing main compression on the temporarily compressed first portion. The performing of the main compression may provide a temperature and pressure that are greater than a temperature and pressure provided in the performing of the temporary compression to the first portion.

The stage may move the panel after the performing of the temporary compression and before the performing of the main compression.

The first portion may be moved in a state in which the first portion is temporarily compressed to the first pad area and before the performing of the main compression.

According to an embodiment of the present invention, equipment for manufacturing an electronic device includes: a stage configured to receive a panel having an active area and a peripheral area including a first pad area and a second pad area adjacent to the active area on a plane; and a first compression unit configured to align a circuit board to be adjacent to the panel and to compress the circuit board to the panel. The circuit board includes a main portion, a first portion extending from one side of the main portion, and a second portion extending from one side of the main portion and spaced from the first portion, and the first compression unit includes: a fixing and pressing module configured to adhere to the first portion and compress the first portion to the first pad area; and a fixing module configured to adhere to the second portion and align the second portion to be spaced from the first portion with the panel therebetween.

The first pad area may be on one side of the panel, and the second pad area may be on the other side of the panel.

The fixing module may adhere to the second portion, the panel may be arranged such that the one side thereof is above the other side thereof on a cross-section, the fixing and pressing module may be aligned so that the first portion is on the one side of the panel, and the fixing module may be aligned so that the second portion is on the other side of the panel.

Each of the fixing and pressing module and the fixing module may adhere to the same surface of the circuit board.

The fixing and pressing module may include: an adherence part configured to adhere to the first portion; and a pressing part configured to press the first portion to the first pad area. The pressing part may press the first portion adhered by the adherence part.

In the first portion, an area adhered by the adherence part and an area compressed by the pressing part may overlap each other on a plane.

The stage may include: a first support part configured to support the panel; and a second support part configured to support at least a portion of the circuit board.

The second support part may support the second portion.

The second support part may adhere to the other surface of the second portion.

The equipment may further include a backup module configured to support a portion of the panel when the fixing and pressing module is adhered to the first portion. The first support part may overlap the active area of the panel, and the backup module may overlap the first pad area.

The equipment may further include: an additional pressing module separate from the pressing module and configured to press the first portion compressed to the panel; and an additional compression unit separate from the backup module and including an additional backup module configured to support a portion of the panel. The panel and the circuit board are coupled to each other by the compression unit and are provided to the additional compression unit, and the additional compression unit provides heat and pressure greater than those applied by the first compression unit.

The stage may move from the compression unit to the additional compression unit.

The equipment may further include a second compression unit configured to compress the second portion of the circuit board to the panel.

The panel and the circuit board may be provided to the second compression unit in a state in which the first portion is coupled to the panel.

The second compression unit may include: a clamp module configured to clamp at least a portion of the second portion; and a pressing module configured to press the second portion on the second pad area.

The panel may be arranged such that the other side is above the one side on a cross-section, and the clamp module may horizontally and vertically move the second portion such that the second portion is on the other side to overlap the second pad area on a plane.

The equipment may further include a reverse unit configured to receive the panel and the circuit board and to reverse the panel. The panel and the circuit board may be provided to the reverse unit in a state in which the first portion is coupled to the panel.

The stage may move from the first compression unit to the reverse unit.

The reverse unit may include: a rotation module including a first base part, an adherence part on one side of the first base part to adhere to a top surface of the panel and a top surface of the circuit board, and a rotation part connected to the first base part to rotate the first base part; and a movable module on the rotation module and configured to horizontally move. The moveable module may include a second base part and an adherence part on one side of the second base part. The rotation module may rotate the panel and the circuit board so that the other surface of the panel and the other surface of the circuit board are arranged above the top surface of the panel and the top surface of the circuit board on a cross-section, and the movable module may adhere to the other surface of the panel and the other surface of the circuit board to horizontally move the panel and the circuit board.

The reverse unit may provide the panel and the circuit board to the second compression unit.

The stage may include a first stage and a second stage, which are separate from each other, the first stage may pass through the first compression unit and the reverse unit, and the second stage may pass through the second compression unit.

The first stage may include a first support part configured to support the panel and a second support part configured to support the second portion, the second stage may include a third support part configured to support the panel and a fourth support part configured to support the second portion, the second support part may fix the second portion to the other side of the panel, and the fourth support part may fix the second portion to one side of the panel.

The equipment may further include: a first inspection module configured to inspect the first pad area; and a second inspection module configured to inspect the second pad area. The first inspection module and the second inspection module may respectively inspect the first pad area and the second pad area concurrently (e.g., at the same time).

The equipment may further include a third compression unit configured to receive the panel and the circuit board from the second compression unit. The peripheral area may further include a third pad area adjacent to the first pad area and spaced from the second pad area with the first pad area therebetween on a plane, the circuit board may further include a third portion connected to the main portion and spaced from the second portion with the first portion therebetween on the plane, and the third compression unit may compress the third portion to the third pad area.

The third pad area may be defined on the other side of the panel, and the panel may be provided to the third compression unit in a state in which the other side thereof is above the one side thereof.

BRIEF DESCRIPTION OF THE DRAWINGS

The accompanying drawings are included to provide a further understanding of the present invention and are incorporated in and constitute a part of this specification. The drawings illustrate exemplary embodiments of the present invention and, together with the description, serve to explain aspects and features of the present invention. In the drawings.

DETAILED DESCRIPTION

Figure 1:
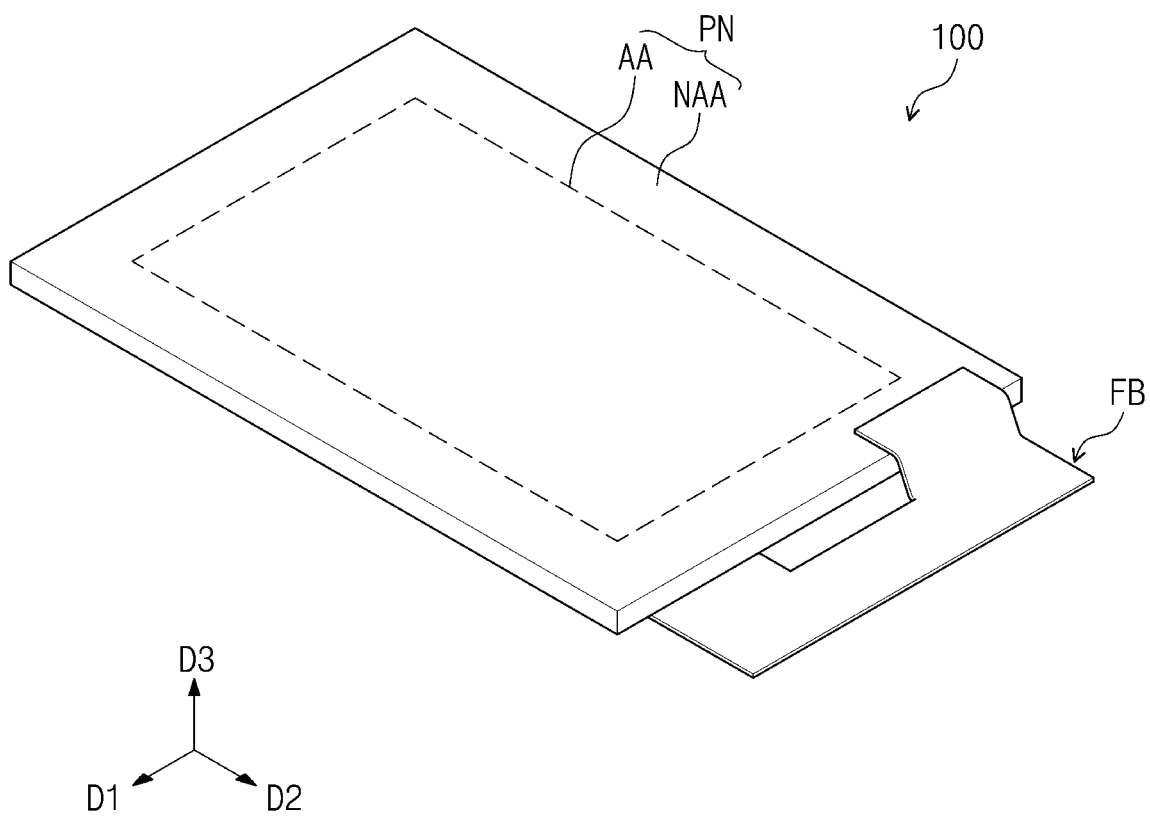
FIG. 1 is a perspective view of an electronic device according to an embodiment of the present invention.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

The electronic element and/or any other relevant devices or components according to embodiments of the present invention described herein may be implemented utilizing any suitable hardware, firmware (e.g., an application-specific integrated circuit), software, and/or a suitable combination of software, firmware, and hardware. For example, the various components of the electronic element may be formed on one integrated circuit (IC) chip or on separate IC chips. Further, the various components of the electronic element may be implemented on a flexible printed circuit film, a tape carrier package (TCP), a printed circuit board (PCB), or formed on a same substrate as the electronic element. Further, the various components of the electronic element may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present invention.

Hereinafter, an electronic device, such as a display apparatus, according to embodiments of the present invention will be described with reference to the drawings.

Figure 2:
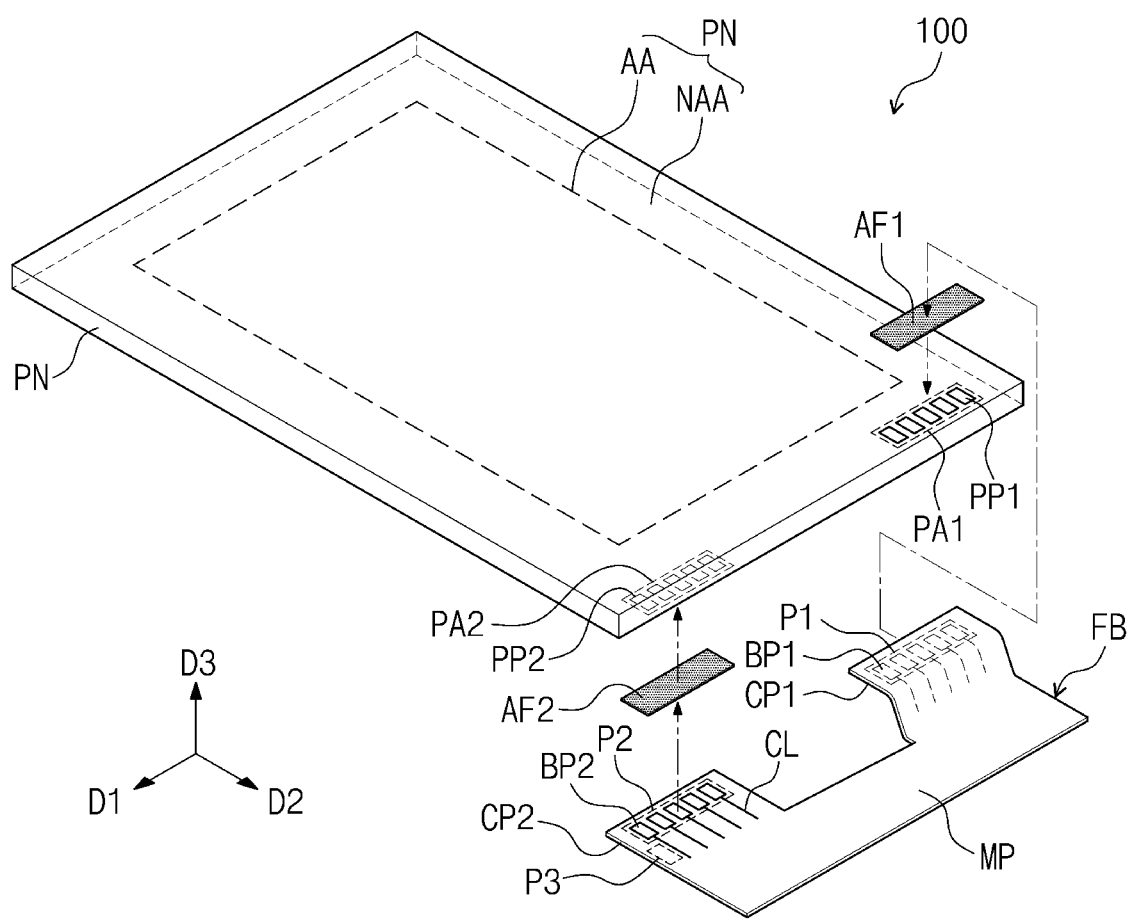
FIG. 2 is an exploded perspective view of the electronic device shown in FIG. 1.

FIG. 1 is a perspective view of an electronic device according to an embodiment of the present invention. FIG. 2 is an exploded perspective view of the electronic device shown in FIG. 1. Hereinafter, an electronic device 100 according to an embodiment of the present invention will be described with reference to FIGS. 1 and 2.

The electronic device 100 may be operated according to an electric signal and may include, as examples, a display device or a touch screen. As illustrated in FIGS. 1 and 2, the electronic device 100 may be a display device 100, and the display device 100 includes a panel PN, a circuit board FB, and a plurality of coupling members AF1 and AF2.

The panel PN is activated according to an electric signal. The panel PN may include various electronic elements driven according to an electric signal. In the illustrated embodiment, the panel PN may have a plate shape on a plane defined by a first direction D1 and a second direction D2. However, the present invention is not limited by the shape of the panel PN. For example, the panel PN, according to other embodiments of the present invention, may have various suitable shapes.

The panel PN may be divided into an active area AA and a peripheral area NAA on a plane. The active area AA may have a rectangular shape parallel to the plane defined by the first direction D1 and the second direction D2. However, the present invention is not limited by the shape of the active area AA. For example, the active area AA, according to other embodiments of the present invention, may have various suitable shapes.

The active area AA may be activated according to an electric signal.

For example, the active area AA may be a display area for displaying an image according to an electric signal. In other embodiments, the active area AA may be a touch area for detecting a touch applied from the outside according to an electric signal. However, the present invention is not limited by the types of the panel PN. For example, the panel PN, according to other embodiments of the present invention, may be an electronic panel configured to perform various operations.

The peripheral area NAA is disposed adjacent to the active area AA. In the illustrated embodiment, the peripheral area NAA has a frame shape surrounding an edge of (e.g., surrounding a periphery of) the active area AA. However, the present invention is not limited by the shape of the peripheral area NAA. For example, the peripheral area NAA may have various suitable shapes as long as the peripheral area NAA is disposed adjacent to at least one side (or edge) of the active area AA.

The peripheral area NAA may include a first pad area PA1 and a second pad area PA2. The first pad area PA1 and the second pad area PA2 are spaced from (e.g., spaced apart from) each other on a plane.

A plurality of first panel pads PP1 may be disposed on the first pad area PA1, and a plurality of second panel pads PP2 may be disposed on the second pad area PA2. The first panel pads PP1 and the second panel pads PP2 may receive and/or output different electric signals.

In some embodiments, the first panel pads PP1 and the second panel pads PP2 may be disposed on different surfaces (e.g., on different surfaces of the panel PN). For example, the first panel pads PP1 may be disposed on a top surface of the panel PN, and the second panel pads PP2 may be disposed on a bottom surface of the panel PN. Accordingly, a surface on which the first pad area PA1 is defined and a surface on which the second pad area PA2 is defined may be different from each other.

The circuit board FB includes an insulation layer, a plurality of circuit wirings CL mounted on the insulation layer, and circuit pads BP1 and BP2 respectively connected to the circuit wirings CL. Each of the circuit wirings CL may receive an electric signal from the circuit pads BP1 and BP2 or may provide an electric signal to the outside (e.g., to the panel PN) through the circuit pads BP1 and BP2.

The circuit board FB may include an electronic element mounted on the insulation layer and connected to the circuit wirings CL. The electronic element may be operated by receiving an electric signal (e.g., may be operated according to a received electric signal) from a portion of (e.g., from some of or a group of) the circuit wirings CL connected thereto and may output a corresponding electric signal to another portion of (e.g., to some other ones of or another group of) the connected circuit wirings CL.

The circuit board FB includes a main portion MP, a first portion CP1, and a second portion CP2. The main portion MP may have a shape having a length extending in the first direction D1 and a width extending in the second direction D2. However, the present invention is not limited by the shape of the main portion MP. For example, the main portion MP, according to embodiments of the present invention, may have various suitable shapes. The electronic element mounted on the circuit board and a portion of the circuit wirings CL connected to the electronic element from among the circuit wirings CL may be disposed on the main portion MP.

Each of the first portion CP1 and the second portion CP2 extends from one side (e.g., one edge) of the main portion MP (e.g., the same side or edge of the main portion MP). The first pads BP1 and the circuit wirings CL connected to the first pads BP1 (e.g., the portion of or the group of the circuit wirings CL connected to the first pads BP1) from among the circuit wirings CL may be disposed on the first portion CP1. The second pads BP2 and the circuit wirings CL connected to the second pads BP2 (e.g., the portion of or the group of the circuit wirings CL connected to the second pads BP2) from among the circuit wirings CL may be disposed on the second portion CP2. The circuit wirings CL connect the first and second pads BP1 and BP2 to the electronic element.

In the illustrated embodiment, the first portion CP1 and the second portion CP2 protrude from the main portion MP in the same direction. However, the present invention is not limited by the shapes of the first and second portions CP1 and CP2. For example, each of the first and second portions CP1 and CP2 may have various suitable shapes.

The first pads BP1 and the second pads BP2 may receive and/or output different electric signals from and/or to the panel PN. The first pads BP1 and the second pads BP2 may be electrical connections between (e.g., may be passages for electrically connecting) the electric element mounted on the main portion MP and the panel PN.

The first pads BP1 and the second pads BP2 may be respectively disposed on different surfaces (e.g., on different surfaces of the circuit board FB). For example, as illustrated in FIG. 2, the first pads BP1 may be disposed on a bottom surface of the first portion CP1, and the second pads BP2 may be disposed on a top surface of the second portion CP2. In other embodiments, the first pads BP1 may be disposed on the top surface of the first portion CP1, and the second pads BP2 may be disposed on the bottom surface of the second portion CP2.

The conductive coupling members AF1 and AF2 are provided between the circuit board FB and the panel PN. Each of the conductive coupling members AF1 and AF2 may be adhesive. Accordingly, the plurality of conductive coupling members AF1 and AF2 may physically couple the circuit board FB to the panel PN.

Each of the plurality of conductive coupling members AF1 and AF2 may be electrically conductive. Accordingly, the plurality of conductive coupling members AF1 and AF2 electrically couple the circuit board FB to the panel PN. For example, the plurality of conductive coupling members AF1 and AF2 connect the panel pads PP1 and PP2 of the panel PN to the pads BP1 and BP2 of the circuit board FB, respectively.

Each of the plurality of conductive coupling members AF1 and AF2 may be a conductive adhesion member, such as, for example, an anisotropic conductive film (ACF). The plurality of conductive coupling members AF1 and AF2 physically couple and electrically connect the circuit board FB to the panel PN.

The plurality of conductive coupling members AF1 and AF2 include a first conductive coupling member AF1 and a second conductive coupling member AF2. The first conductive coupling member AF1 and the second conductive coupling member AF2 may be independent from each other (e.g., may be separate components).

The first conductive coupling member AF1 is disposed on the bottom surface of the first portion CP1 to cover the first pads BP1. The first conductive coupling member AF1 couples the first portion CP1 to the panel PN. The first panel pads PP1, the first pads BP1, and the first conductive coupling member AF1 overlap each other on a plane in a state in which the circuit board FB is coupled to the panel PN.

The second conductive coupling member AF2 is disposed on the top surface of the second portion CP2 to cover the second pads BP2. The second conductive coupling member AF2 couples the second portion CP2 to the panel PN. The second panel pads PP2, the second pads BP2, and the second conductive coupling member AF2 overlap each other on a plane in the state in which the circuit board FB is coupled to the panel PN.

As the circuit board FB, according to an embodiment of the present invention, includes the plurality of pads BP1 and BP2 disposed on surfaces different from each other, the first portion CP1 and the second portion CP2 may be cross-coupled to the panel PN (e.g., may be coupled to the panel PN in a crossed-type configuration) in a cross-section. For example, the circuit board FB (e.g., one circuit board FB) may be electrically connected to both surfaces (e.g., opposite surfaces or upper and lower surfaces) of the panel PN.

A first portion P1 and a second portion P2 may be defined on at least a portion of the first portion CP1 and the second portion CP2, respectively. The first portion P1 may be a portion of the first portion CP1 on which the first conductive coupling member AF1 is disposed, and the second portion P2 may be a portion of the second portion CP2 on which the second conductive coupling member AF2 is disposed.

A third portion P3 may be defined on at least a portion of the circuit board FB. The third portion P3 may be adjacent to the second portion P2. The third portion P3 may not overlap the second conductive coupling member AF2 and may also not overlap the circuit wirings CL.

The third portion P3 may be a portion of the second portion CP2 on which the second portion P2 is not defined or a portion of the main portion MP that does not overlap the circuit wirings CL. The third portion P3, defined on one side of the second portion P2, is illustrated in FIG. 2. However, the present invention is not limited by the position of the third portion P3. For example, the third portion P3, according to embodiments of the present invention, may be defined in various suitable areas.

The third portion P3 may be a portion that contacts a portion of a fixing tool that will be further described later.

Figure 3A:
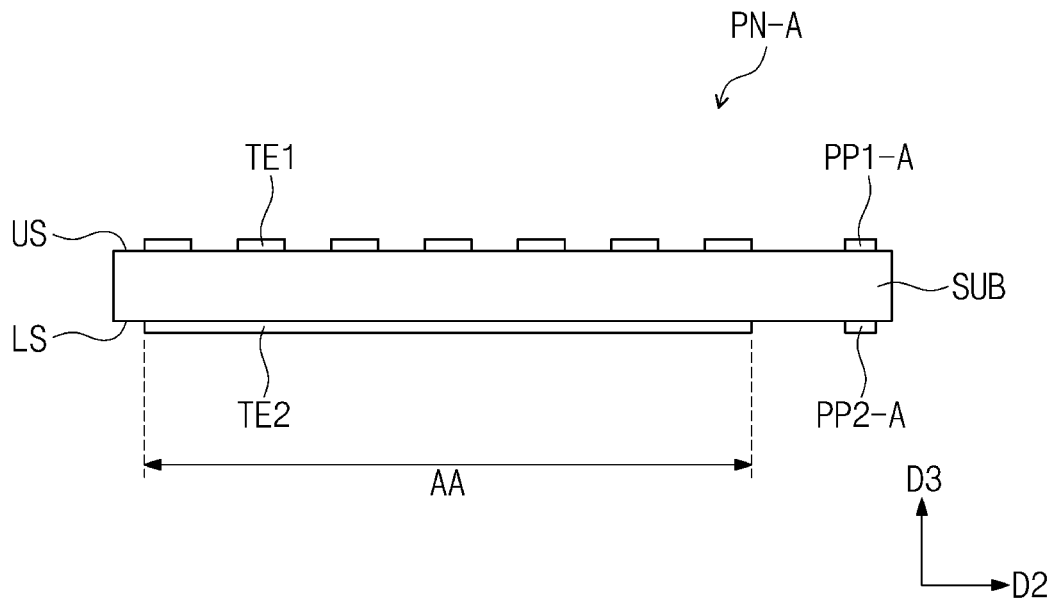
FIGS. 3A-3C are cross-sectional views of a partial configuration of the electronic device shown in FIG. 1.
Figure 3B:
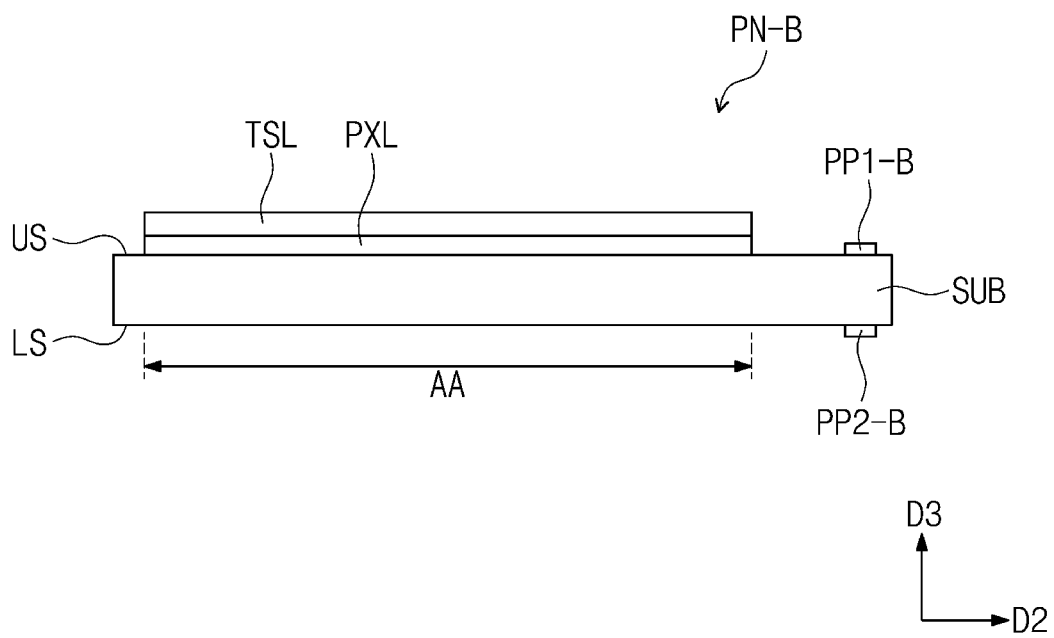
Figure 3C:
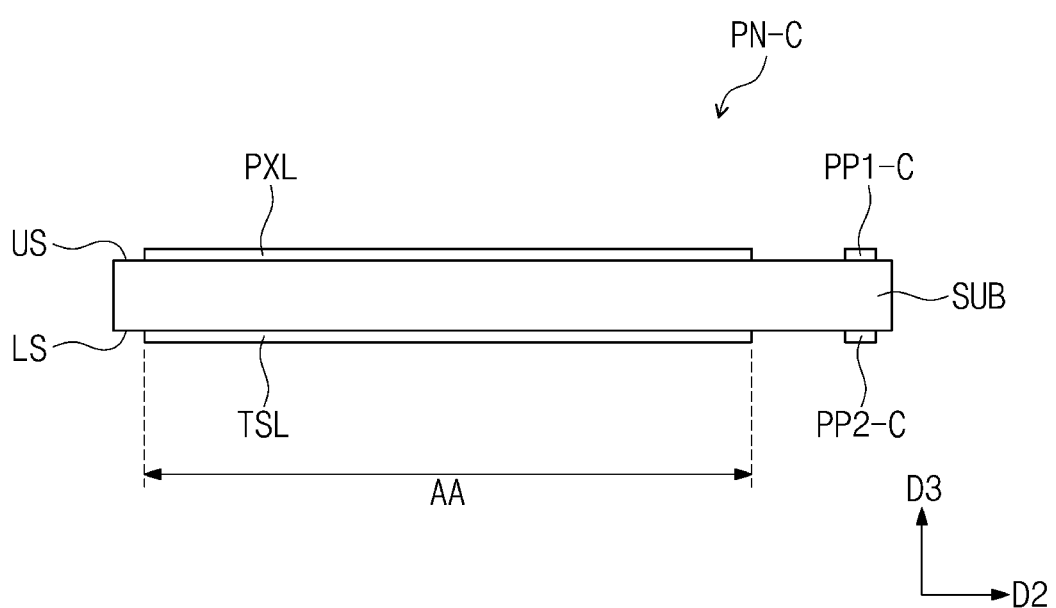

FIGS. 3A-3C are cross-sectional views of a partial configuration of the electronic device shown in FIG. 1. Panels PN-A, PN-B, and PN-C, according to different embodiments of the present invention, are illustrated in FIGS. 3A-3C, respectively.

As illustrated in FIG. 3A, the panel PN-A, according to an embodiment of the present invention, may be a touch panel. The panel PN-A may include a substrate SUB, a first electrode layer TE1, a second electrode layer TE2, first panel pads PP1-A, and second panel pads PP2-A.

Each of the first electrode layer TE1 and the second electrode layer TE2 may include a plurality of conductive patterns. The conductive patterns of the first electrode layer TE1 and the conductive patterns of the second electrode layer TE2 may be arranged in directions crossing each other.

The first electrode layer TE1 may be disposed on a top surface US of the substrate SUB, and the second electrode layer TE2 may be disposed on a bottom surface LS of the substrate SUB. The first electrode layer TE1 and the second electrode layer TE2 may be insulated (e.g., may be insulated from each other) by the substrate SUB.

The first electrode layer TE1 may be connected to the outside through the first panel pads PP1-A, and the second electrode layer TE2 may be connected to the outside through the second panel pads PP2-A. The panel PN-A may detect a touch provided to the active area AA of the panel PN-A through the first electrode layer TE1 and the second electrode layer TE2.

A panel, according to another embodiment of the present invention, may be a touch screen panel including a touch sensor layer TSL for detecting a touch applied from the outside and a pixel layer PXL for displaying an image. The panels PN-B and PN-C, each corresponding to a touch screen panel, are illustrated in FIGS. 3B and 3C, respectively.

The touch sensor layer TSL may include a conductive layer including a plurality of conductive patterns and an insulation layer. The touch sensor layer TSL may include the first electrode layer TE1 and the second electrode layer TE2, both of which are illustrated in FIG. 3A, and the insulation layer disposed between the first electrode layer TE1 and the second electrode layer TE2. In other embodiments, the touch sensor layer TSL may include a single sensor electrode layer, a connecting electrode layer disposed on the electrode layer, and an insulation layer disposed between the sensor electrode layer and the connecting electrode layer. However, the touch sensor layer TSL may have various suitable structures configured to detect a touch applied from the outside, and the present invention is not limited to the described embodiments.

The pixel layer PXL may include a plurality of pixels, each of which includes a thin film transistor and a display element connected thereto. The display element may display an image according to an electric signal. For example, the display element may include an organic light emitting element, a liquid crystal capacitor, an electrophoretic element, and/or an electrowetting element. However, the present invention is not limited by these types of display elements. For example, the pixel layer PXL, according to an embodiment of the present invention, may include the display element having various suitable shapes.

As illustrated in FIG. 3B, the panel PN-B may include a pixel layer PXL disposed on one surface US of the substrate SUB and a touch sensor layer TSL disposed on the pixel layer PXL. The pixel layer PXL and the touch sensor layer TSL are disposed on the same surface.

In some embodiments, first panel pads PP1-B may be connected to one of the pixel layer PXL and the touch sensor layer TSL, and second panel pads PP2-B may be connected to the other one of the pixel layer PXL and the touch sensor layer TSL. The other of the pixel layer PXL and the touch sensor layer TSL may pass through the substrate SUB and may be connected to the second panel pads PP2-B. Accordingly, a signal wiring for controlling the pixel layer PXL and a signal wiring for controlling the touch sensor layer TSL may be disposed on surfaces different from each other to reduce an effect (e.g., an electromagnetic effect) on each other.

In other embodiments, the first panel pads PP1-B may be connected to a portion of the pixel layer PXL and a portion of the touch sensor layer TSL, and the second panel pads PP2-B may be connected to the other portion of the pixel layer PXL and the other portion of the touch sensor layer TSL.

As illustrated in FIG. 3C, the panel PN-C may include a pixel layer PXL disposed on one surface US of the substrate SUB and a touch sensor layer TSL disposed on the other surface LS of the substrate SUB. The pixel layer PXL and the touch sensor layer TSL are disposed on surfaces different from each other. Accordingly, the first panel pads PP1-C and the second panel pads PP2-C may transmit signals different from each other on layers different from each other. However, the present invention is not limited thereto.

As both surfaces of the substrate SUB are electrically activated, the electronic device, according to an embodiment of the present invention, may provide a thin film type electronic device or an electronic device having a complex function. Also, according to an embodiment of the present invention, the plurality of panel pads may be distributed on surfaces different from each other to prevent interference between the panel pads and a usable area, on which the panel pads are disposed, may be expanded. Also, according to an embodiment of the present invention, because the pad areas disposed on the surfaces different from each other are connected through one circuit board, a simplified electronic device may be provided.

Figure 4:
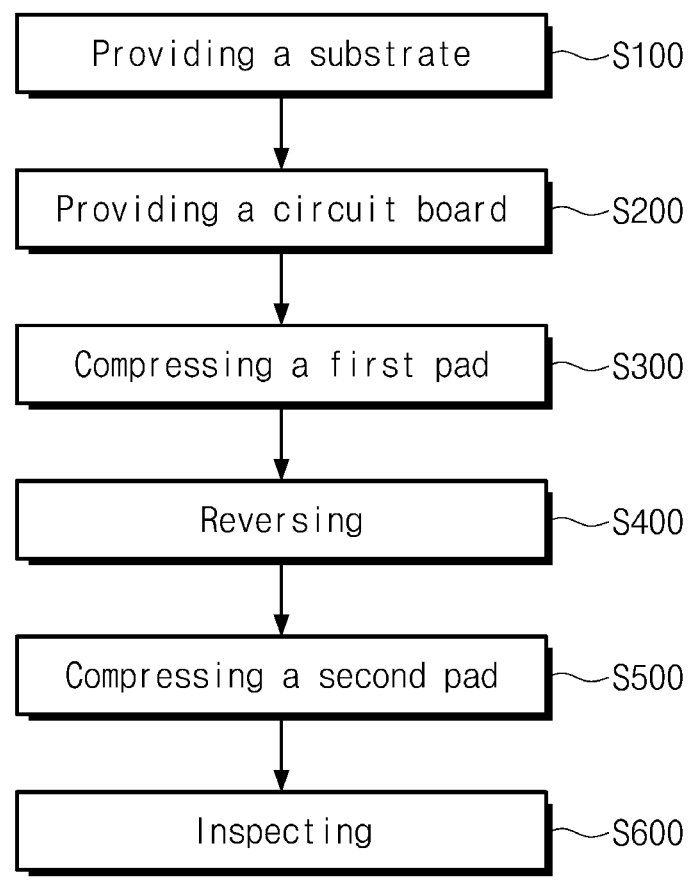
FIG. 4 is a flowchart illustrating a method of manufacturing an electronic device according to an embodiment of the present invention.

FIG. 4 is a flowchart illustrating a method of manufacturing an electronic device according to an embodiment of the present invention. As illustrated in FIG. 4, to manufacture an electronic device according to an embodiment of the present invention, first, a process (S100) of providing a substrate and a process (S200) of providing a circuit board are performed. In this embodiment, the substrate and the circuit board are sequentially provided. However, this is only an exemplarily embodiment and, thus, the sequence is changeable. In some embodiments, the substrate and the circuit board may be provided at the same time (e.g., concurrently).

The process (S100) of providing the substrate may include providing a conductive coupling member to the substrate, and the process (S200) of providing the circuit board may include providing the conductive coupling member to the circuit board.

Thereafter, a process (S300) of compressing a first pad is performed. In the process (S300) of compressing the first pad, the first pad of the circuit board may be compressed on a first pad area of the substrate.

Thereafter, a process (S400) of reversing is performed. The circuit board and the substrate, which are coupled to each other through the first pad, may be reversed (e.g., flipped over) such that a second pad area of the substrate may face upward. A further detailed description of this process will be provided later.

Thereafter, a process (S500) of compressing a second pad is performed. In the process (S500) of compressing the second pad, the second pad of the circuit board may be compressed on the second pad area of the substrate.

Thereafter, a process (S600) of inspecting is performed. The process (S600) of inspecting may be performed in a state in which the second pad faces upward. In some embodiments, the process of reversing (e.g., flipping over) may occur before the process (S600) of inspecting, and accordingly, the process (S600) of inspecting may be performed in a state in which the first pad faces upward. A further detailed description of this process will be provided later.

Figure 5A:
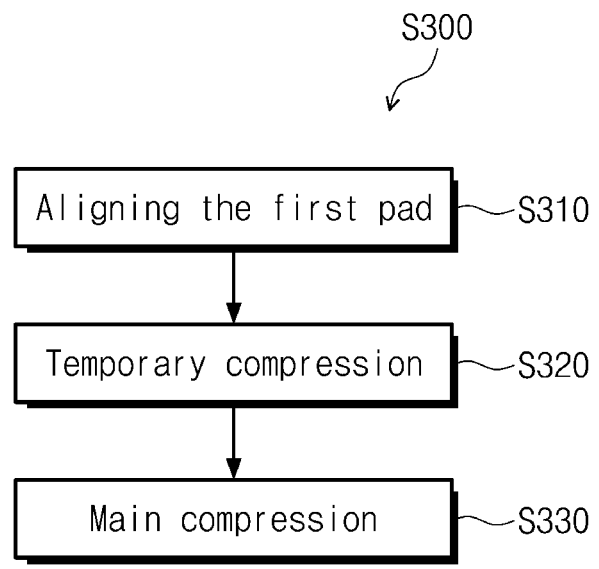
FIG. 5A is a flowchart illustrating a portion of the method of manufacturing an electronic device illustrated in FIG. 4.
Figure 5B:
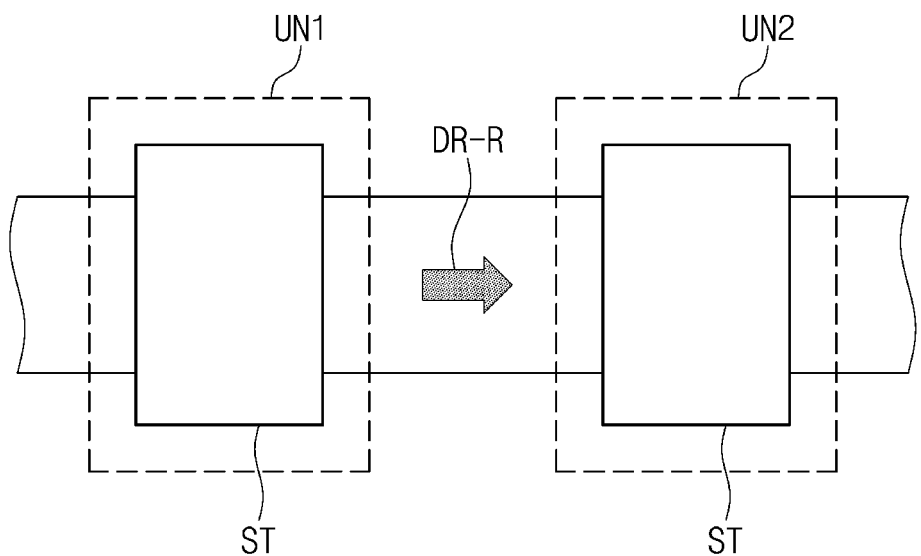
FIG. 5B is a schematic plan view of a portion of electronic device manufacturing equipment according to an embodiment of the present invention.

FIG. 5A is a flowchart illustrating a portion of the method of manufacturing the electronic device illustrated in FIG. 4. FIG. 5B is a schematic plan view of a portion of electronic device manufacturing equipment according to an embodiment of the present invention. Referring to FIGS. 5A and 5B, the method of manufacturing an electronic device according to an embodiment of the present invention will be further described.

As illustrated in FIG. 5A, the process (refer to S300 in FIG. 4) of compressing the first pad may include a process (S310) of aligning the first pad, a process (S320) of performing temporary compression, and a process (S330) of performing main compression. The process (S310) of aligning the first pad, the process (S320) of performing the temporary compression, and the process (S330) of performing the main compression may be sequentially performed.

For ease of description, a stage ST, a first unit UN1, and a second unit UN2 of components of the electronic device manufacturing equipment are illustrated in FIG. 5B. The process (S310) of aligning the first pad and the process (S320) of performing the temporary compression may be performed in the first unit UN1. The process (S330) of performing the main compression may be performed in the second unit UN2.

In this embodiment, the process (S320) of performing the temporary compression and the process (S330) of performing the main compression may be separately performed by separate units. Accordingly, the process (S320) of performing the temporary compression and the process (S330) of performing the main compression, which have process parameters different from each other, may be independently controlled and consecutively performed without break time or substantially without break time (e.g., without a waiting period or substantially without a waiting period) to prepare a process parameter or environment, thereby reducing process time.

The stage ST may be commonly used in the first unit UN1 and the second unit UN2. The stage ST may be moved from the first unit UN1 to the second unit UN2. A direction in which the first unit UN1 is spaced from the second unit UN2 may be a movement direction DR-R of the substrate.

In the manufacturing equipment according to an embodiment of the present invention, the stage ST may pass through the plurality of units UN1 and UN2. Accordingly, the panel PN (refer to FIG. 1) and the circuit board FB (refer to FIG. 1) may be provided to the second unit UN2 in a state in which the panel PN and the circuit board FB are temporarily compressed by the first unit UN1. Accordingly, although the process (S320) of performing the temporary compression and the process (S330) of performing the main compression are performed by the units UN1 and UN2, which are different from each other, the temporarily compressed state may be easily maintained to increase process stability.

However, the present invention is not limited to the above-described processes. For example, the electronic device manufacturing equipment according to an embodiment of the present invention may perform the process (S320) of performing the temporary compression and the process (S330) of performing the main compression by using one unit. Hereinafter, the electronic device manufacturing equipment according to an embodiment of the present invention will be further described with reference to the drawings.

Figure 6:
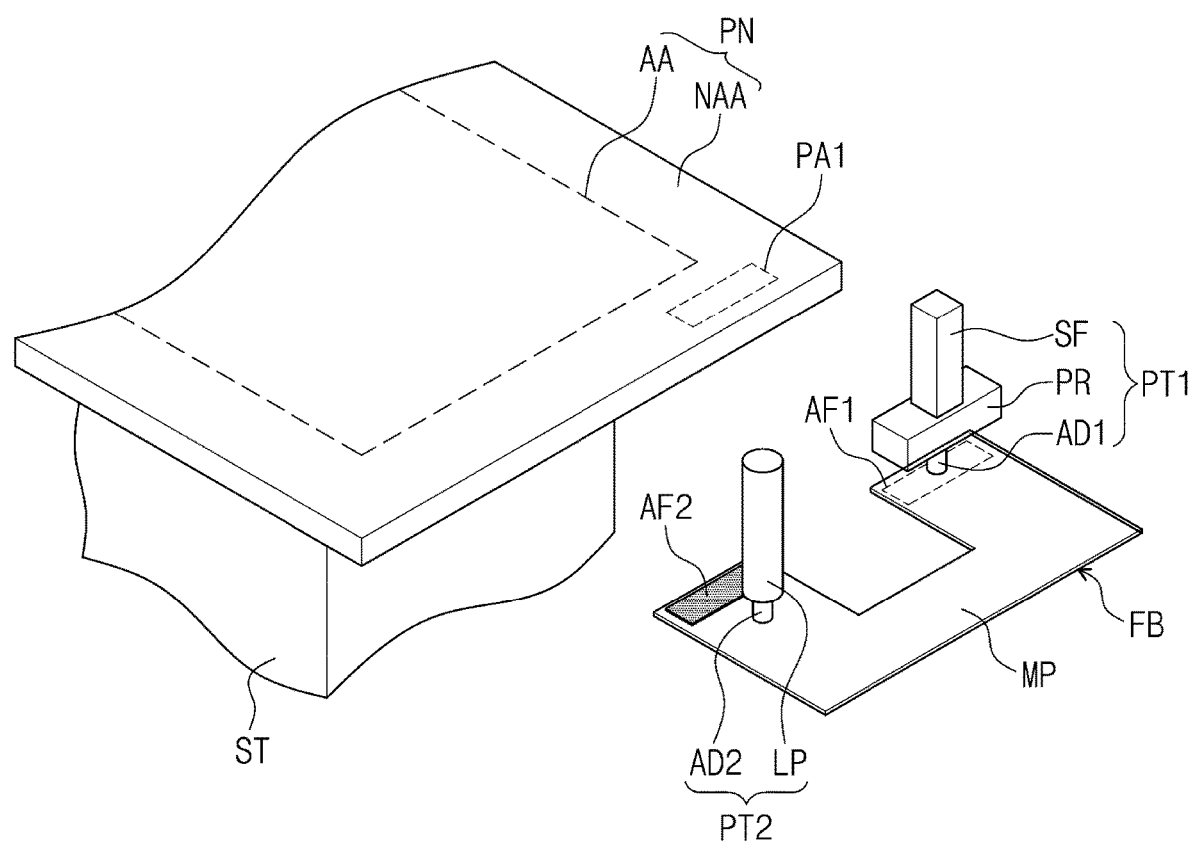
FIG. 6 is a schematic perspective view of electronic device manufacturing equipment according to an embodiment of the present invention.

FIG. 6 is a schematic perspective view of electronic device manufacturing equipment according to an embodiment of the present invention. FIGS. 7A-7E are cross-sectional views of the electronic device manufacturing equipment according to an embodiment of the present invention. For ease of description, in FIGS. 7A-7E, the electronic device manufacturing equipment is illustrated according to a manufacturing process.

Hereinafter, an embodiment of the present invention will be described with reference to FIGS. 6-7E. The same or substantially similar elements or components as those described in FIGS. 1-5B are designated by the same reference symbols, and repeated descriptions thereof may be omitted.

Figure 7A:
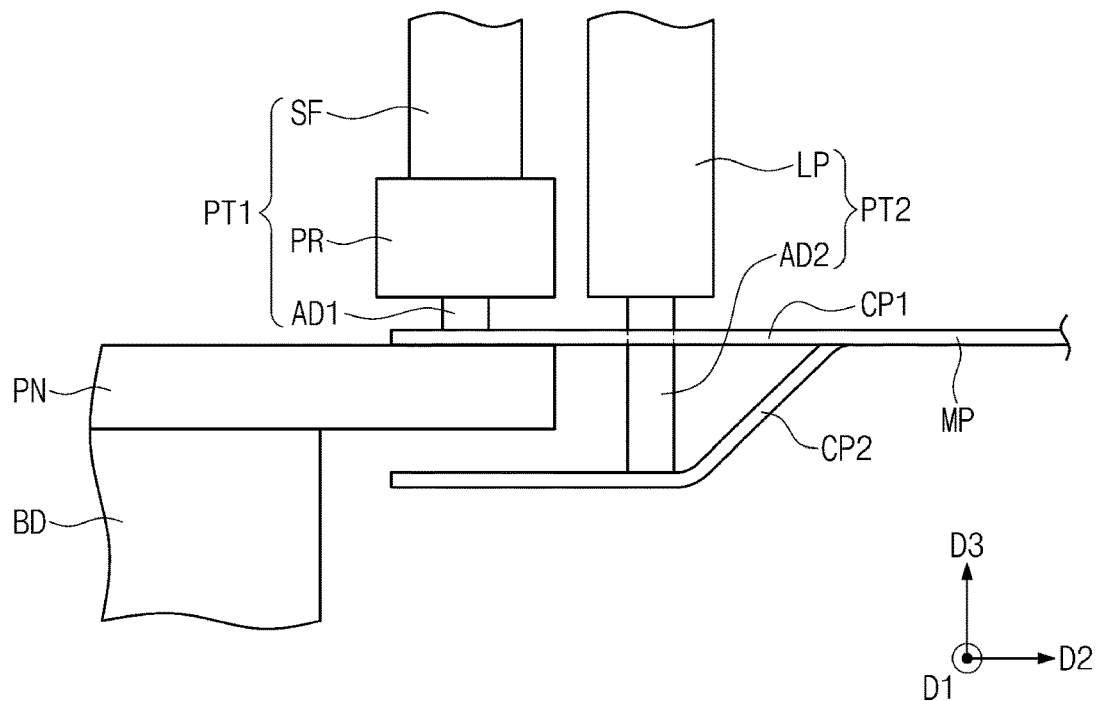
FIGS. 7A-7E are cross-sectional views of electronic device manufacturing equipment according to an embodiment of the present invention.

As illustrated in FIGS. 6 and 7A, a first compression unit couples the first portion CP1 to the panel PN. For example, in the first compression unit, the first portion CP1 may be aligned to be disposed adjacent to the panel PN and compressed on the first pad area PA1.

The first compression unit includes a first module PT1 and a second module PT2. The first module PT1 (hereinafter referred to as a fixing and pressing module) fixes and presses the first portion CP1. The fixing and pressing module PT1 may include an adherence part AD1, a pressing part PR, and a length part SF.

The adherence part AD1 adheres to (e.g., is releasably fixed to) a top surface of the first portion CP1. Adhesion, as used in this specification, may include adherence according to a shape, such as a concave projection, and/or adherence according to flow control of air (e.g., vacuum adherence). The adherence part AD1 may externally contact a top surface of the first portion CP1. The first portion CP1 may be fixed to the first module PT1 by the adherence part AD1 and may be moved by movement of the first module PT1.

The pressing part PR presses the top surface of the first portion CP1. The pressing part PR applies a pressure (e.g., a predetermined pressure) to the first portion CP1 to easily couple the first portion CP1 to the first pad area PA1. The pressing part PR may provide heat (e.g., predetermined heat) to the first portion CP1 (e.g., the pressing part PR may heat the first portion CP1). The heat and pressure activates the first conductive adhesion member AF1 disposed between the first portion CP1 and the panel PN to allow the first portion CP1 to be stably coupled to the first pad area PA1. As the pressing part PR compresses the first portion CP1, the first pads P1 (refer to FIG. 2) of the first portion CP1 and the first panel pads PP1 (refer to FIG. 2) may be electrically connected to each other.

The length part SF physically connects the adherence part AD1 and the pressing part PR to a main body. The length part SF may have a linear shape extending in the third direction D3. A change of length of the length part SF (e.g., extension of the length path SF) may control a vertical movement of the pressing part PR and the adherence part AD1. And a change of movement of the length part SF (e.g., displacement of the length path SF) in a plan view may control a horizontal movement of the pressing part PR and the adherence part AD1.

The second module PT2 (hereinafter referred to as a fixing module) fixes the second portion CP2. As the fixing module PT2 adheres to (e.g., is releasably fixed to) a top surface of the second portion CP2, the second portion CP2 may be fixed to the fixing module PT2. The second portion CP2 may be moved by movement of the fixing module PT2.

The fixing module PT2 includes a length part LP and an adherence part AD2. The length part LP of the fixing module PT2 extends in the third direction D3. The length part LP of the fixing module PT2 and the length part SF of the first module PT1 may be parallel (or substantially parallel) to each other.

The adherence part AD2 of the fixing module PT2 adheres to the top surface of the second portion CP2. Accordingly, the second portion CP2 is fixed to the fixing module PT2. The second portion CP2 may be moved by the movement of the fixing module PT2.

Figure 7B:
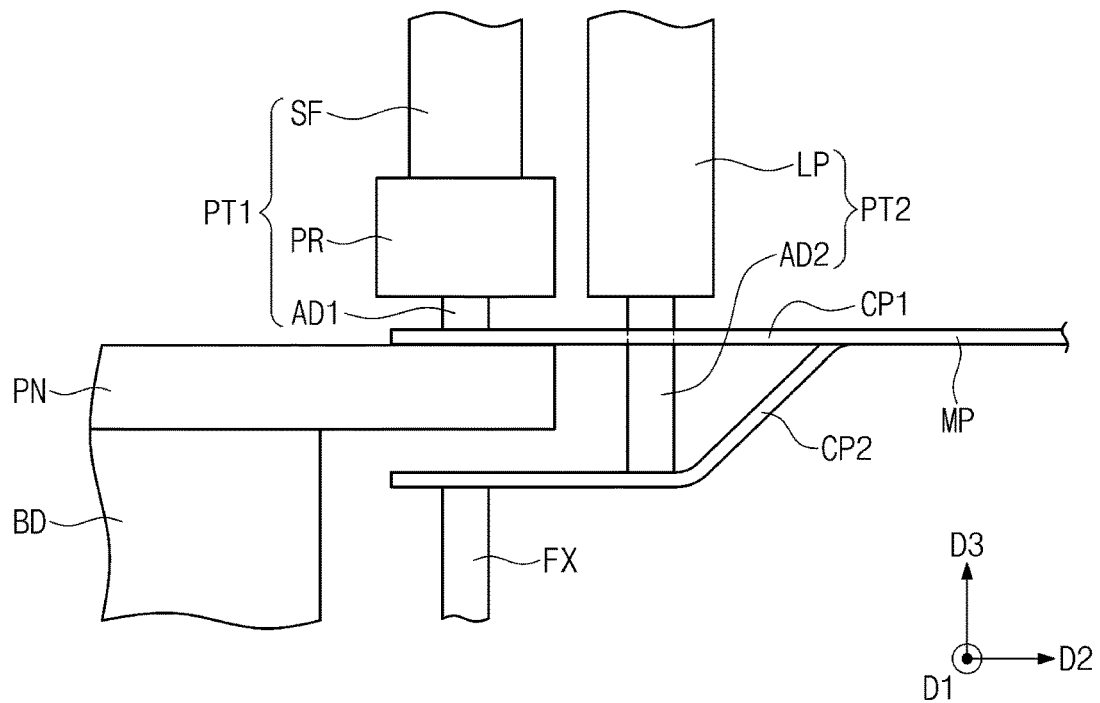
Figure 7C:
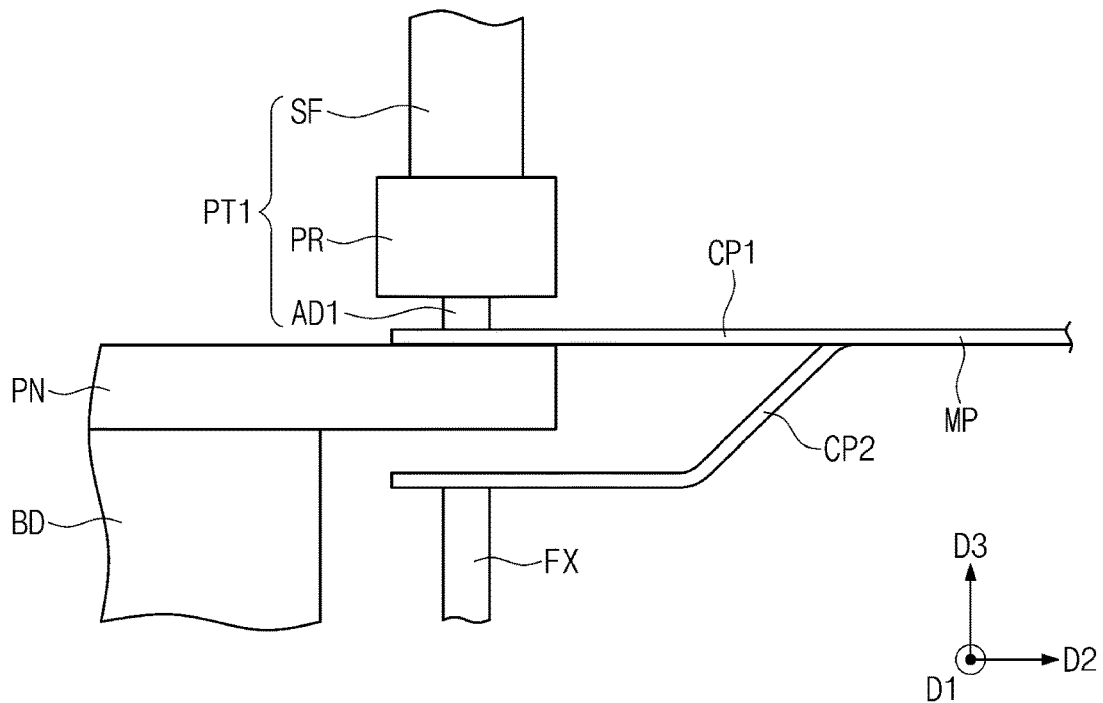
Figure 7D:
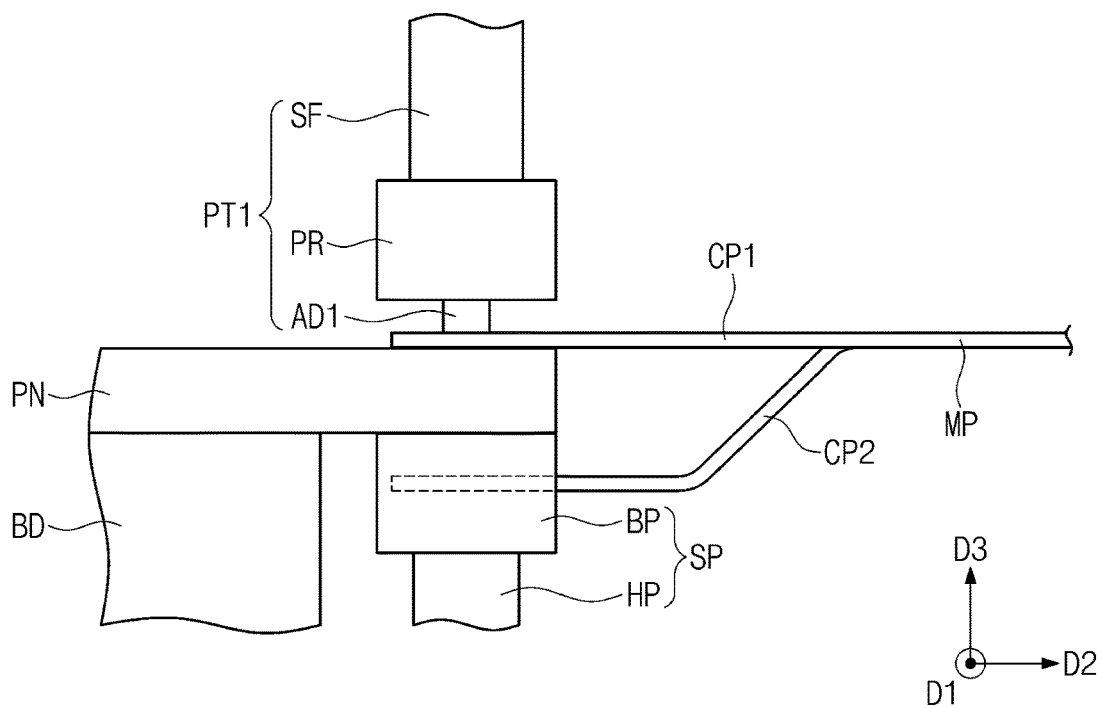
Figure 7E:
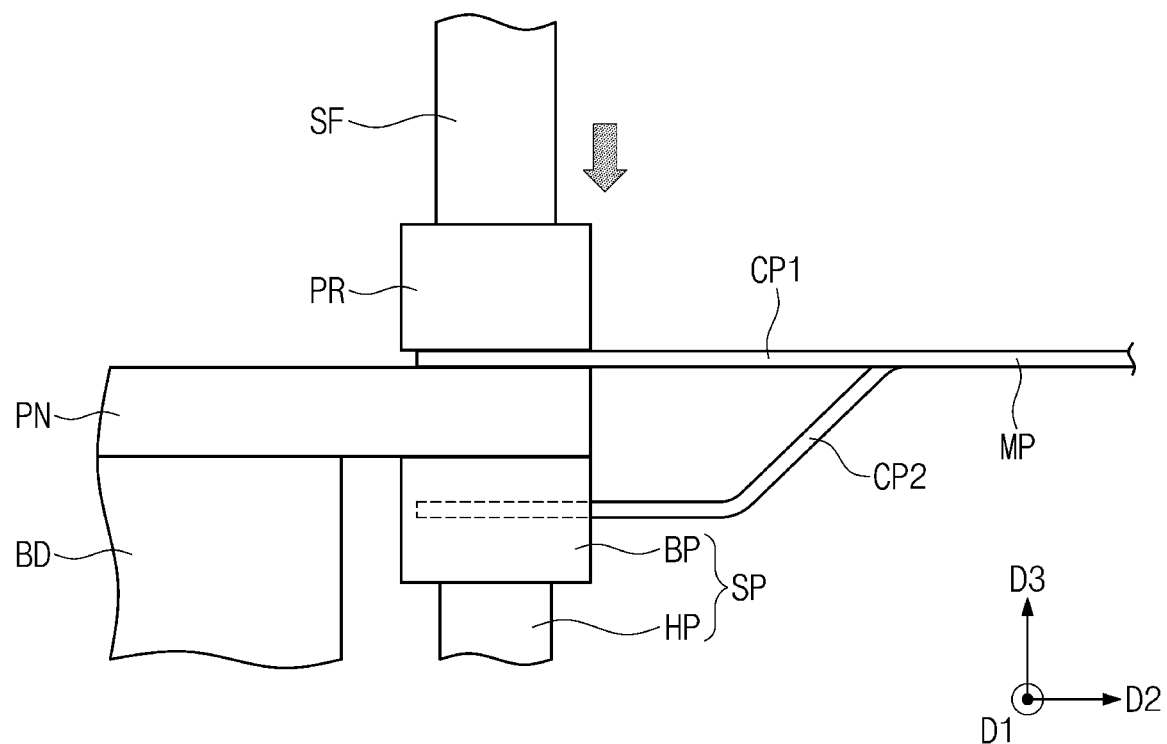

FIGS. 7A-7C are cross-sectional views of the process (S310) of aligning of the first pad, and FIGS. 7D and 7E are cross-sectional views of the process (S320) of performing the temporary compression.

As illustrated in FIGS. 6 and 7A-7C, when the panel PN is provided to the first compression unit, the first compression unit moves the circuit board FB so that the circuit board FB is aligned to be disposed adjacent to the panel PN (e.g., to be adjacent to the panel PN).

The panel PN may be provided by or through the stage ST. The stage ST may receive the panel PN from outside of the first compression unit and may move the panel PN to the first compression unit. However, the present invention is not limited by the position of the stage ST. For example, the stage ST may be disposed on the first compression unit.

The stage ST includes a first support part BD. The first support part BD supports the panel PN. The first support part BD may overlap the active area AA of the panel PN on a plane. The panel PN may be disposed on the first support part BD such that the first pad area PA1 protrudes outside of the first support part BD.

The fixing and pressing module PT1 and the fixing module PT2 move the circuit board FB to be disposed adjacent to the panel PN. As the fixing and pressing module PT1 and the fixing module PT2 move, the first portion CP1, which is fixed to the fixing and pressing module PT1, and the second portion CP2, which is fixed to the fixing module PT2, may be moved to be disposed adjacent to the portion of the panel PN protruding outside the first support part BD.

As illustrated in FIG. 7A, the fixing and pressing module PT1 aligns the first portion CP1 such that the first portion CP1 is disposed above (or extends above) the panel PN. For example, the first portion CP1 contacts the adherence part AD1 of the fixing and pressing module PT1.

The fixing module PT2 may align the second portion CP2 such that the second portion CP2 is disposed below (or extends below) the panel PN. The second portion CP2 contacts the adherence part AD2 of the fixing module PT2, and the fixing module PT2 aligns the second portion CP2 below the panel PN through vertical movement of the length part LP.

In the illustrated embodiment, the circuit board FB may be disposed adjacent to the panel PN and then vertically moved to determine the positions of the first portion CP1 and the second portion CP2. Accordingly, as the stage ST horizontally moves the panel PN, a positional relationship between the panel PN and the circuit board FB on a plane may be adjusted. According to an embodiment of the present invention, fine alignment between the circuit board FB and the panel PN may be performed by the vertical movement of each of the fixing and pressing module PT1 and the fixing module PT2 and the horizontal movement of the first support part BD of the stage ST.

Thereafter, as illustrated in FIG. 7B, the second portion CP2 may be fixed by a second support part FX. Thereafter, as illustrated in FIG. 7C, the second portion CP2 may be stably fixed below (e.g., may be stably positioned below) the panel PN by the second support part FX after the fixing module PT2 is removed (e.g., after the second portion CP2 is released from the fixing module PT2). Accordingly, in a process of compressing the first portion CP1, which will be performed later, an interference problem caused by the second portion CP2 may be prevented.

The second support part FX may be connected to the stage ST. As the stage ST further includes the second support part FX, both of the panel PN and the circuit board FB may be stably supported during these processes.

The second support part FX may adhere to the second portion CP2. Accordingly, the second support part FX may stably fix the position of the second portion CP2 regardless of external influence. However, the present invention is not limited by the position of the second support part FX. For example, the second support part FX may physically support the second portion CP2 so that the second portion CP2 is not deflected or is not substantially deflected.

The second support part FX may be separately provided with respect to the stage ST. For example, the second support part FX may be one component of the first compression unit or a component separate from the first compression unit and the stage ST. In such embodiments, the second support part FX may be controlled independently from the first compression unit or the stage ST. However, the second support part FX is not limited thereto.

Thereafter, as illustrated in FIGS. 7D and 7E, a portion of the panel PN may be supported by using a backup module SP, and the first portion CP1 may be pressed by using the pressing part PR. In the illustrated embodiment, the backup module SP supports at least a portion of the panel PN. The backup module SP may support a portion of the panel PN that is not supported by the first support part BD.

The backup module SP may include a length part HP and a head part BP. The length part HP may extend in the third direction D3. The length part HP may support the head part BP. The head part BP contacts the lower surface of the panel PN to support the panel PN. The head part BP may support the first pad area PA1 (refer to FIG. 2) of the panel PN.

Because the second portion CP2 is fixed while being spaced from the first portion CP1 in the first direction D1 (e.g., because the second portion CP2 is offset along a same plane as the head part BP), a portion of the second portion CP2 that overlaps the head part BP is illustrated by a dotted line. For example, the backup module SP overlaps the first portion CP1 and does not overlap the second portion CP2 on a plane.

Thereafter, the pressing part PR is vertically moved to press the first portion CP1. The pressing part PR may be vertically moved by or along the length part SF of the fixing and pressing module PT1. The pressing part PR may cover more than the first pad area PA1 (refer to FIG. 2). In the illustrated embodiment, the backup module SP, the first pad area PA1, and the pressing part PR may overlap each other on a plane.

Because the electronic device manufacturing equipment according to an embodiment of the present invention further includes the backup module SP, the panel PN may not be deformed in the process (S330) of performing the main compression. Also, the pressure of the pressing part PR may be stably applied to the circuit board FB and the panel PN.

FIGS. 8A-8F are cross-sectional views of electronic device manufacturing equipment according to an embodiment of the present invention. For ease of description, a variation of the electronic manufacturing equipment according a manufacturing process is illustrated in FIGS. 8A-8F. Hereinafter, with reference to FIGS. 8A-8F, the electronic device manufacturing equipment will be further described. The same or substantially similar elements as those described in FIGS. 1-7D are designated by the same reference symbols, and repeated descriptions thereof may be omitted.

Schematic cross-sectional views of a reverse unit according to a manufacturing process are illustrated in FIGS. 8A-8F. FIGS. 8A-8F may correspond to the process (S400) of reversing illustrated in FIG. 4.

Figure 8A:
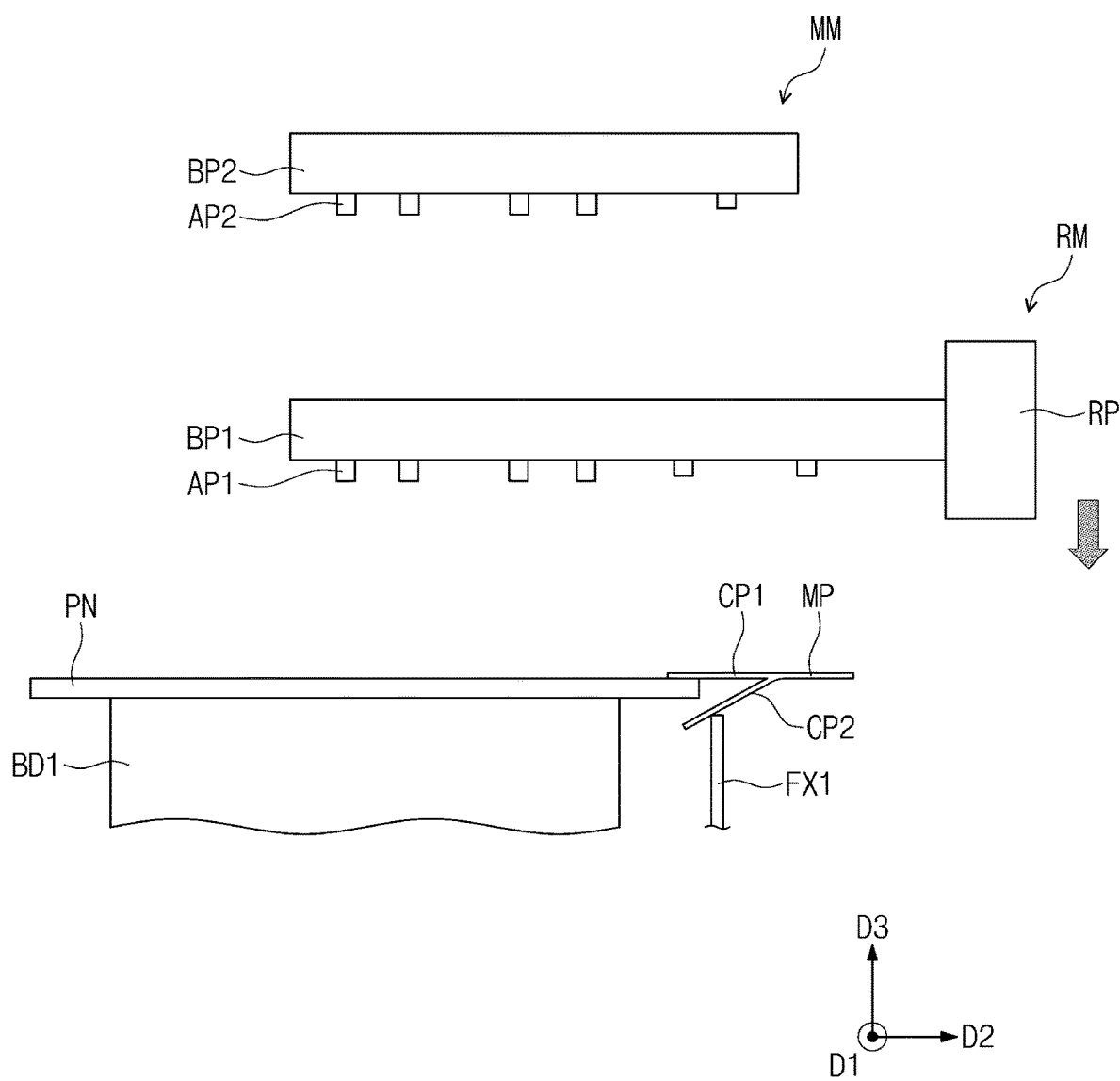
FIGS. 8A-8F are cross-sectional views of electronic device manufacturing equipment according to an embodiment of the present invention.
Figure 8B:
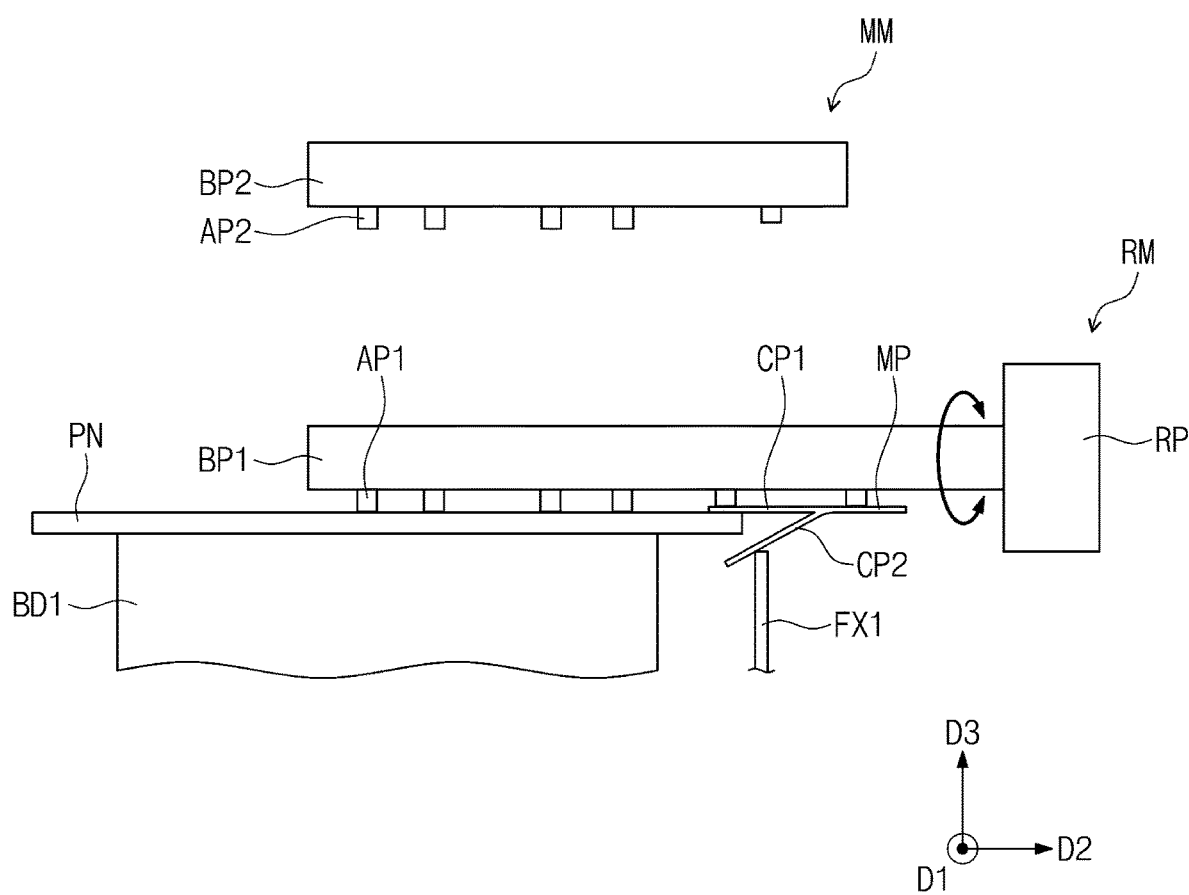
Figure 8C:
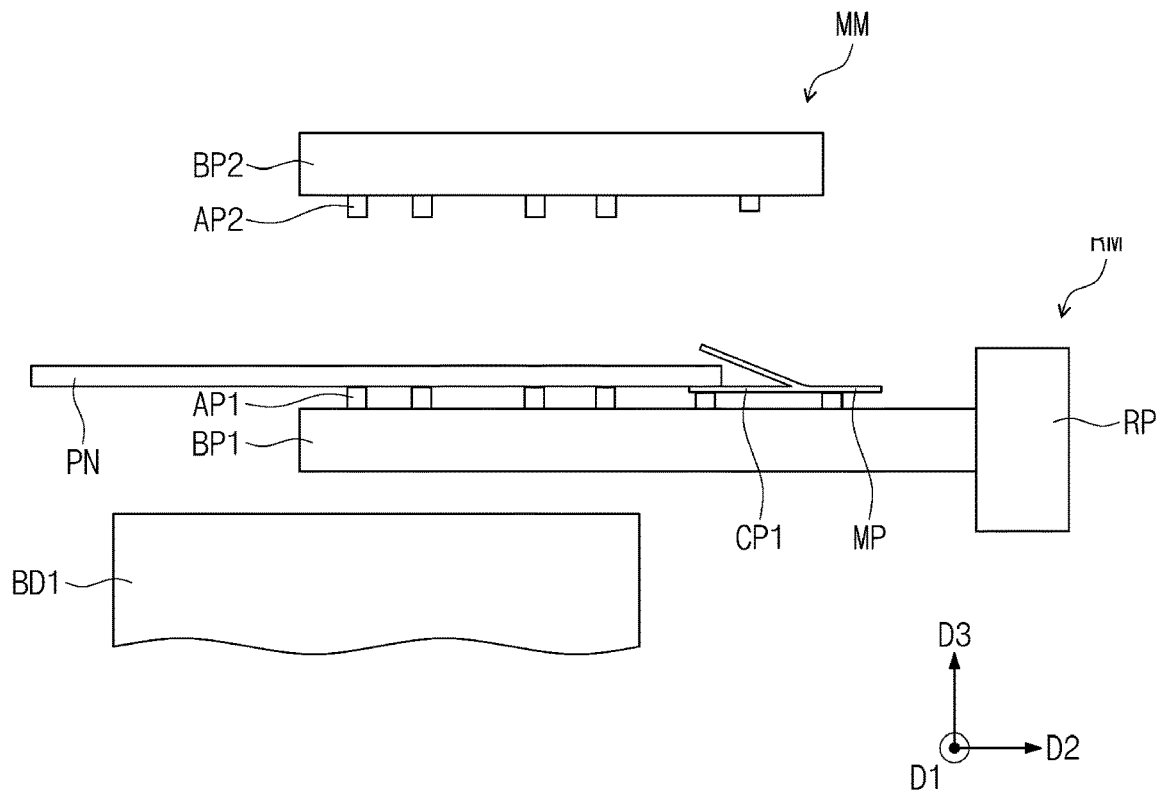

As illustrated in FIGS. 8A-8C, the reverse unit may include a rotation module RM and a movable module MM. When the panel PN, to which the first portion CP1 is coupled, is provided to the reverse unit through the stage ST1 (e.g., the stage ST as shown in FIGS. 7A-E) including the first support part BD1 (e.g., the first support part BD as shown in FIGS. 7A-E) and the second support part FX1 (e.g., the second support part FX as shown in FIGS. 7B and 7C), the rotation module RM may be moved to be disposed adjacent to the panel PN.

The rotation module RM may include a base part BP1, an adherence part AP1, and a rotation part BP. The base part AP1 may have a plate shape parallel to a plane defined by the first direction D1 and the second direction D2. The plate shape may have a shape corresponding to the panel PN or a shape having a length extending in the second direction D2 and a width extending in the first direction D1.

The adherence part AP1 adheres to at least the top surface of the panel PN. Because the panel PN is fixed to the rotation module RM by the adherence part AP1, the panel PN may be moved by movement of the rotation module RM.

A plurality of adherence parts AP1 may be provided to adhere to the top surface of the panel PN, a top surface of the first portion CP1, and a top surface of the main portion MP. When the plurality of the adherence parts AP1 is provided to increase an area contacting the panel PN, the panel PN may be stably fixed to the rotation module RM. Also, because the adherence part AP1 also adheres to the first portion CP1 and the main portion MP, coupling between the first portion CP1 and the panel PN may be stably maintained.

The rotation part RP rotates the base part BP1. The rotation part RP rotates the rotation module RM with respect to a rotational shaft extending in the second direction D2. As the rotation module RM rotates the panel PN with respect to the shaft extending in the second direction D2, a position at which the circuit board FB is disposed on a plane may be equally maintained (e.g., the circuit board FB may be rotated along with the panel PN). The panel PN may be reversed (e.g., rotated or flipped) by rotation of the rotation module RM such that the second portion CP2 faces upward.

Figure 8D:
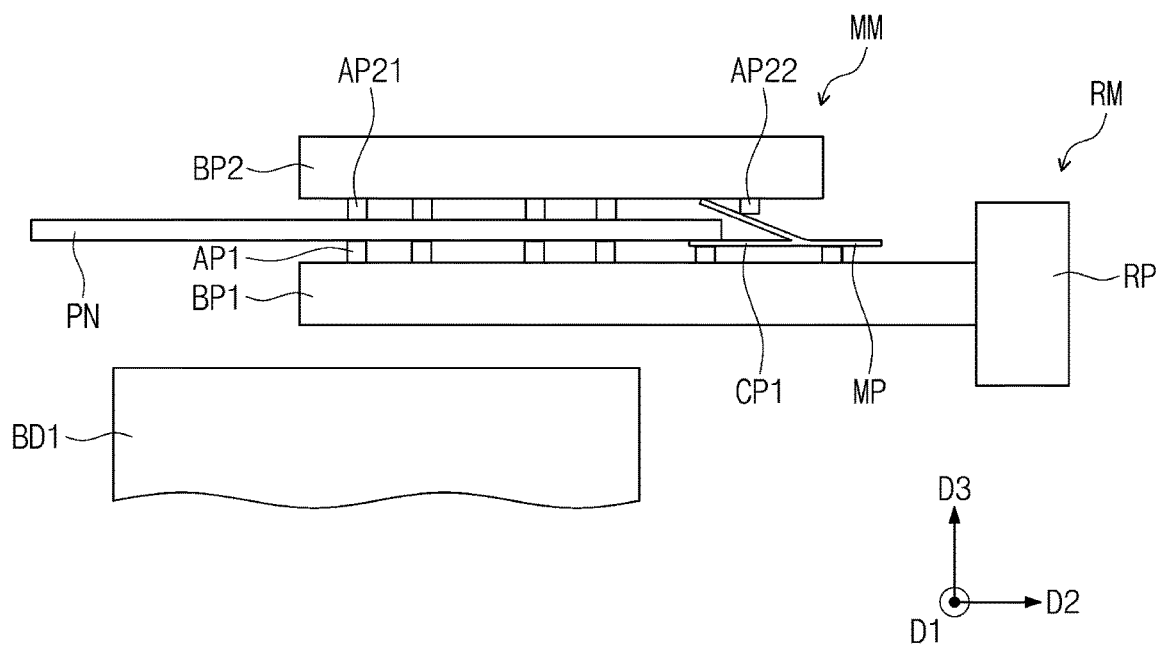

Thereafter, as illustrated in FIG. 8D, the movable module MM and the rotation module RM are disposed adjacent to each other (e.g., are moved to be adjacent to each other) to allow the movable module MM to contact the panel PN. The movable module MM receives the panel PN and the circuit board FB coupled to the panel PN from the rotation module RM.

The moveable module MM includes a base part BP2 and adherence parts AP2 (e.g., adherence parts AP21 and AP22). The base part BP2 of the movable module MM may be parallel to the base part BP1 of the rotation module RM on a plane. The base part BP2 of the movable module MM may overlap at least a portion of the panel PN.

At least one of the adherence parts AP21 and AP22 may adhere to the panel PN (in the embodiment illustrated in FIG. 8D, the adherence part(s) AP21 adhere to the panel PN). Because the bottom surface of the panel PN faces upward after the panel PN is reversed, the at least one of the adherence parts AP21 and AP22 may contact the bottom surface of the panel PN.

The other of the adherence parts AP21 and AP22 may adhere to the circuit board FB (in the embodiment illustrated in FIG. 8D, the adherence part(s) AP22 adhere to the circuit board FB). The movable module MM may stably move the panel PN and the circuit board FB by the adherence parts AP21 and AP22.

Figure 8E:
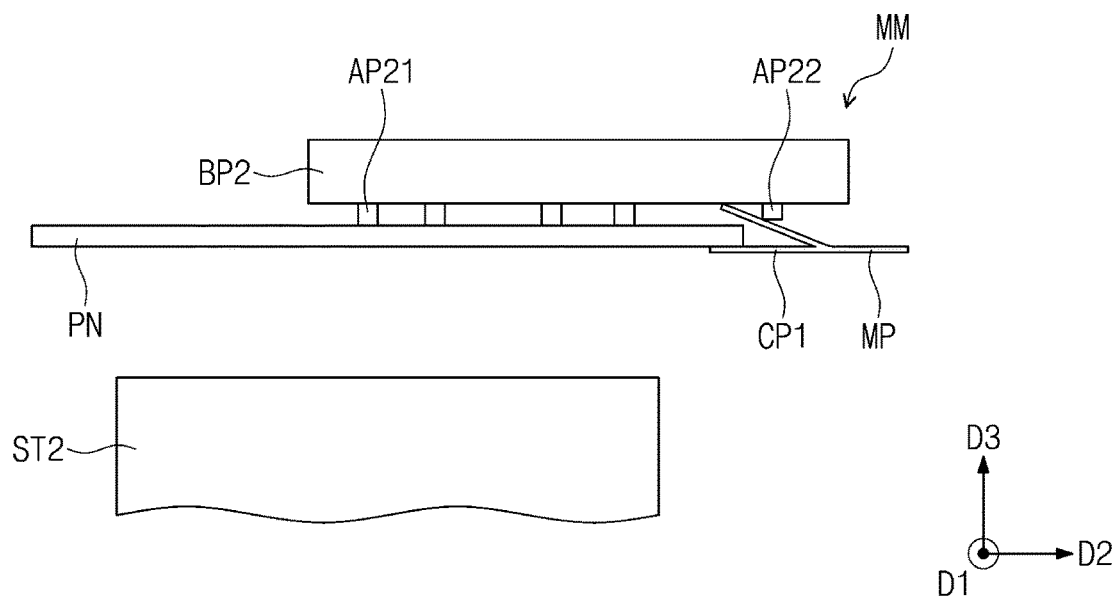
Figure 8F:
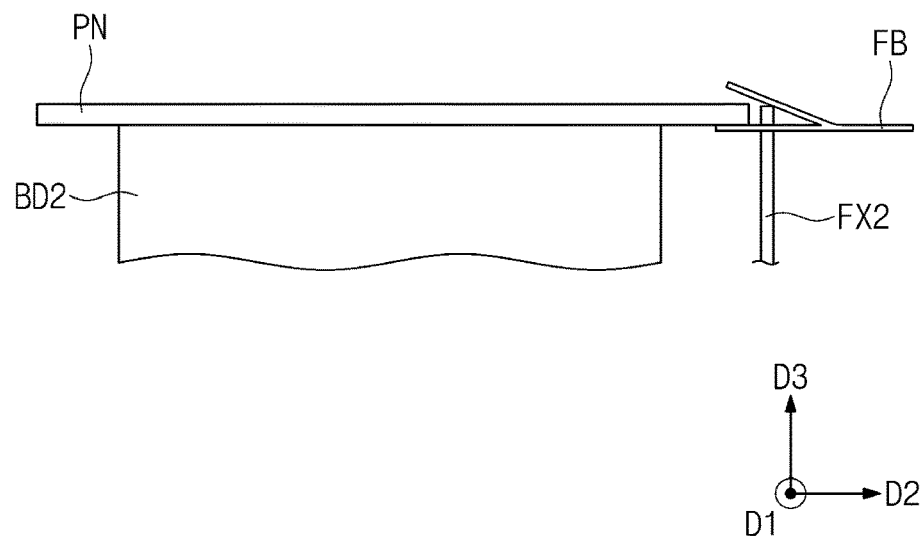

Thereafter, as illustrated in FIGS. 8E and 8F, the movable module MM may horizontally move the panel PN to provide it to a second stage ST2. The second stage ST2 may be separate from the first stage ST1. The second stage ST2 includes a first support part BD2 and a second support part FX2. The first support part BD2 contacts the top surface of the panel PN to support the panel PN. The second support part FX2 may support the second portion CP2 disposed above the panel PN.

The first support part BD2 of the second stage may correspond to (e.g., may be substantially similar to) the first support part BD1 of the first stage ST1. While the second support part FX2 of the second stage ST2 may approximately correspond to the second support part FX1 of the first stage ST1, the second support part FX2 of the second stage ST2 may have a different height than the second support part FX1 of the first stage ST1.

Because the second stage ST2, according to an embodiment of the present invention, further includes the second support part FX2, by which the second stage ST2 is distinguished from the first stage ST1, the second portion CP2 of the panel PN may be stably supported while the position thereof is changed according to the reversal of the panel PN. However, the second support part FX2 may be omitted from the electronic device manufacturing equipment according to other embodiments of the present invention.

Because the reverse unit, according to an embodiment of the present invention, includes the movable module MM, although the panel PN is moved to the different stages, an effect (e.g., stress) on the coupling between the panel PN and the circuit board FB may be reduced or minimized.

Figure 9:
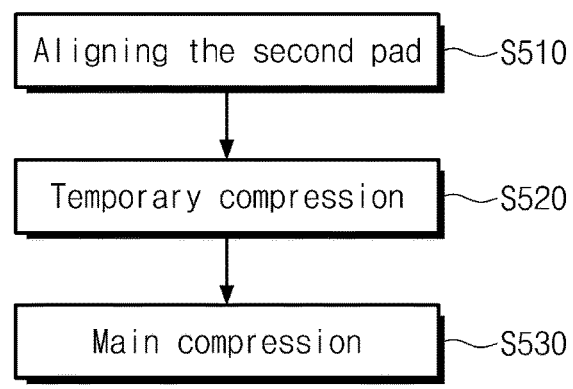
FIG. 9 is a flowchart illustrating a portion of the method of manufacturing an electronic device illustrated in FIG. 4.
Figure 10:
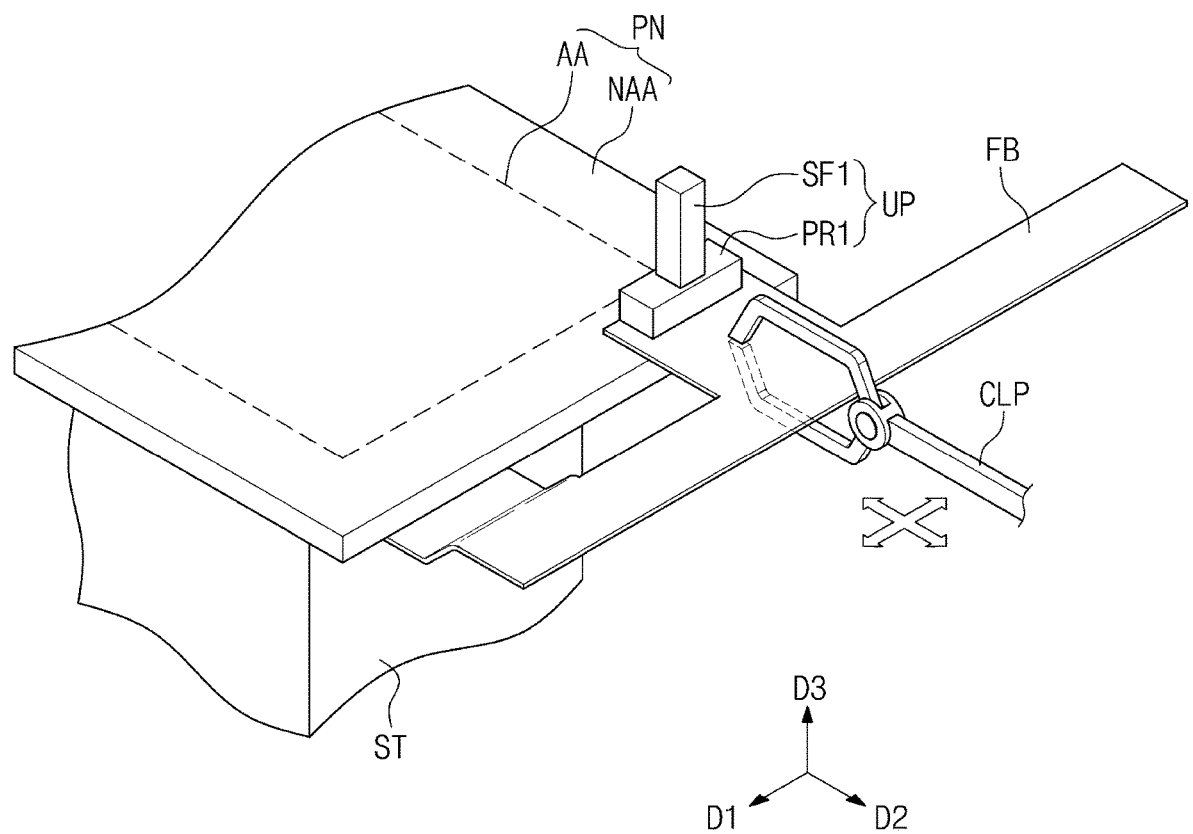
FIG. 10 is a schematic perspective view of a portion of electronic device manufacturing equipment according to an embodiment of the present invention.
Figure 11A:
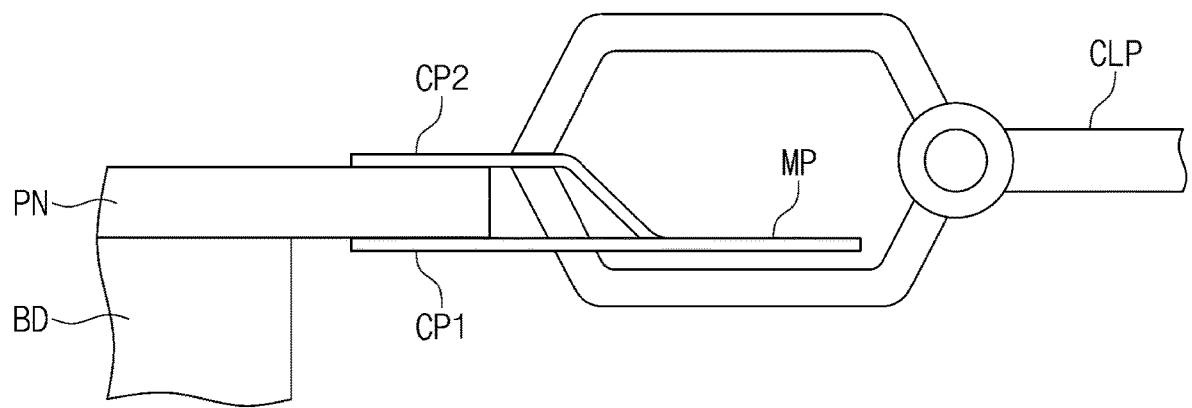
FIGS. 11A-11C are cross-sectional views of electronic device manufacturing equipment according to an embodiment of the present invention.
Figure 11B:
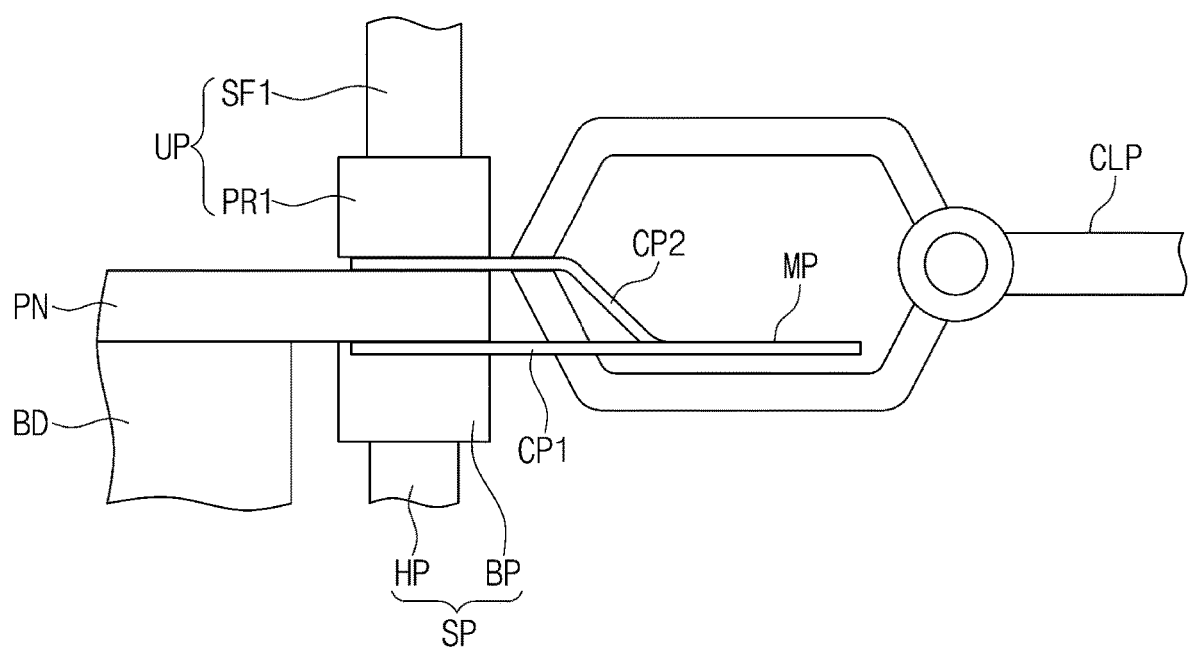
Figure 11C:
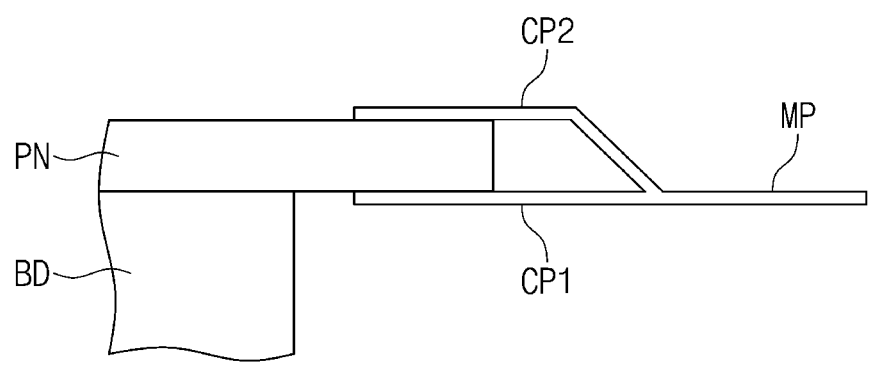

FIG. 9 is a flowchart illustrating a portion of the method of manufacturing the electronic device illustrated in FIG. 4. FIG. 10 is a schematic perspective view of a portion of electronic device manufacturing equipment according to an embodiment of the present invention. FIGS. 11A-11C are cross-sectional views of electronic device manufacturing equipment according to an embodiment of the present invention.

FIG. 9 illustrates a partial process of the manufacturing method illustrated in FIG. 4. FIG. 10 schematically illustrates a second compression unit for compressing the second pad. For ease of description, a variation of the electronic manufacturing equipment according a manufacturing process is illustrated in FIGS. 11A-11C. Hereinafter, an embodiment of the present invention will be described with reference to FIGS. 9-11C. The same elements as those described in FIGS. 1-8F are designated by the same reference symbols, and repeated descriptions thereof may be omitted.

As illustrated in FIG. 9, the process (S500) of compressing the second pad includes a process (S510) of aligning the second pad, a process (S520) of performing temporary compression (or pre-compression), and a process (S530) of performing main compression. The process (S510) of aligning the second pad, the process (S520) of temporary compression, and the process (S530) of main compression may be performed by movement of a single stage. Accordingly, while these processes are performed, the coupling between the panel PN and the circuit board FB may be stably maintained.

As illustrated in FIG. 10, the panel PN is provided to the second compression unit by the stage ST. The stage ST in FIG. 10 may substantially correspond to the second stage ST2 shown in FIG. 8E. The panel PN is provided to the second compression unit in a state in which the panel PN is coupled to the first portion CP1. The panel PN is provided in a state in which the second portion CP2 is over the panel PN (e.g., in a state in which the second pad area PA2 of the panel PN faces upward).

The second compression unit includes a clamp module CLP (e.g., a clamp) and a pressing module UP. The clamp module CLP clamps a portion of the second portion CP2. The clamp module CLP may simultaneously (or concurrently) contact a top surface and a bottom surface of the second portion CP2 to fix the second portion CP2.

The second portion CP2 may be moved by movement of the clamp module CLP. The clamp module CLP may be vertically and horizontally moved. Accordingly, the second portion CP2 may have a degree of freedom (e.g., a known or predetermined degree of freedom) to be horizontally and vertically moved in a state in which the first portion CP1, which is connected to the second portion CP2 through the main portion MP, is coupled to the panel PN. Accordingly, because the clamping module CLP may finely align the second portion CP2, the second portion CP2 may be aligned with improved accuracy.

The pressing module UP presses the second portion CP2. The pressing module UP presses the second portion CP2 on the second pad area PA2 (refer to FIG. 2) to couple the second portion CP2 to the panel PN.

The pressing module UP may include a length part SF1 and a pressing part PR1. The length part SF1 may extend in the third direction D3. The length part SF1 connects a main body of the second compression unit to the pressing part PR1.

The pressing part PR1 may apply pressure or both pressure and heat to the second portion CP2. The pressure may be applied to the second portion CP2 as the pressing part PR1 is vertically moved along the length part SF1, or the pressure may be applied to the second portion CP2 as the length part SF1 is vertically moved.

As illustrated in FIG. 11A, the second portion CP2 is aligned on the panel PN by the clamping module CLP. For example, the second portion CP2 may be aligned to be disposed on the second pad area PA2 of the panel PN.

Thereafter, as illustrated in FIGS. 11B and 11C, the pressing module UP presses the second portion CP2. As the pressing module UP presses the second portion CP2, a state in which the clamping module CLP fixes the second portion CP2 may be maintained. An area of the second portion CP2 fixed by the clamping module CLP and an area pressed by the pressing module UP may not overlap with each other on a plane. Because the second compression unit, according to an embodiment of the present invention, includes the clamping module CLP, the second portion CP2 may be stably compressed in a state in which the second portion CP2 is aligned.

The second compression unit may further include a backup module SP. The backup module SP is provided below the panel PN to support a portion of the panel PN. The backup module SP may include a length part HP and a head part BP. In the illustrated embodiment, the backup module SP may correspond to (e.g., may be the same as or substantially similar to) the backup module SP shown in FIG. 7C but may be disposed on a different position on a plane.

The backup module SP may face the pressing module UP with the panel PN therebetween. Accordingly, the backup module SP, the pressing module UP, and the second pad area PA2 may overlap each other on the plane. The backup module SP and the pressing module UP do not overlap (are offset from) the first portion CP1 on the plane. Accordingly, the second compression unit may not affect the first portion CP1 that is pre-attached (e.g., that was previously attached) to the panel PN and may stably compress the second portion CP2 to the panel PN.

Figure 12:
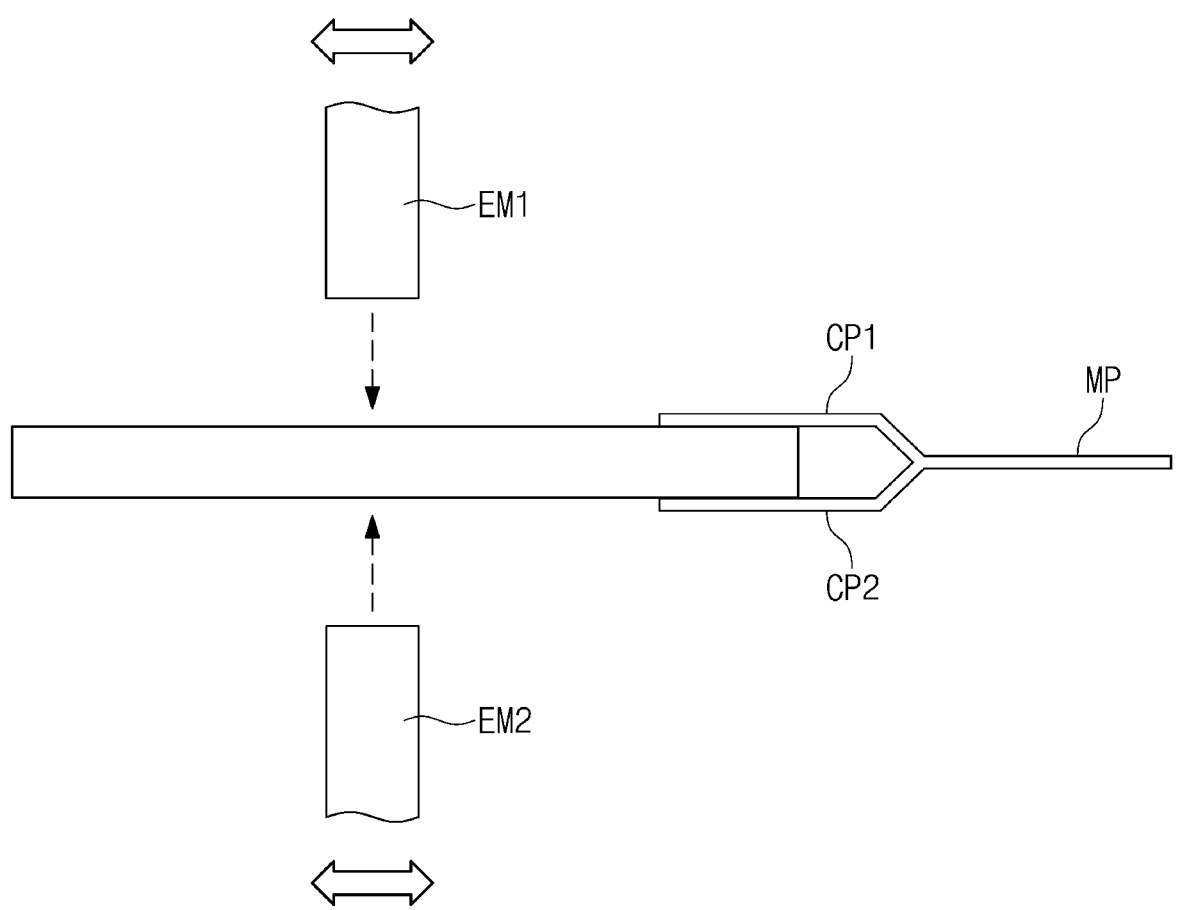
FIG. 12 is a schematic cross-sectional view of electronic device manufacturing equipment according to an embodiment of the present invention.

FIG. 12 is a schematic cross-sectional view of electronic device manufacturing equipment according to an embodiment of the present invention. FIG. 12 illustrates an inspection unit of the electronic device manufacturing equipment. The inspection unit performs the process (S600) of inspecting illustrated in FIG. 4. Hereinafter, the inspection unit according to an embodiment of the present invention will be further described with reference to FIG. 12. The same elements as those described with reference to FIGS. 1-11C are designated by the same reference symbols, and repeated descriptions thereof may be omitted.

As illustrated in FIG. 12, the inspection unit includes a first inspection module EM1 and a second inspection module EM2. The first inspection module EM1 and the second inspection module EM2 may be vertically spaced from each other with the panel PN therebetween.

When the panel PN is provided to the inspection unit, the inspection unit inspects the panel PN. The panel PN provided to the inspection unit may be an electronic device to which each of the first and second portions CP1 and CP2 of the circuit board is coupled. The inspection unit may be driven after the process of compressing the second portion CP2 to the panel PN as illustrated in FIG. 9.

However, the present invention is not limited to this sequence of the inspection unit. For example, the inspection unit may be driven between the process (S300) of compressing the first pad and the process (S400) of reversing. The inspection unit may inspect a coupling state of the first portion CP1 to the panel PN. In other embodiments, electronic device manufacturing equipment may include a plurality of inspection units. The inspection unit may be of various suitable types and are not limited by any one embodiment.

Each of the first inspection module EM1 and the second inspection module EM2 may check a coupling state between the panel PN and the circuit board FB. The first inspection module EM1 may check a coupling state between the panel PN and the first portion CP1, and the second inspection module EM2 may check a coupling state between the panel PN and the second portion CP2.

Each of the first inspection module EM1 and the second inspection module EM2 may inspect (e.g., check) an alignment relationship between the circuit board FB and the panel PN, a defect, such as indentation, and a degree to which a portion of a conductive adhesion member flows outside the first portion CP1 or the second portion CP2.

Because the first inspection module EM1 and the second inspection module EM2 may be horizontally moved to inspect whether or not the electronic device is defective, an inspection of an entire surface of the electronic device may be easily performed even when the stage is fixed. Also, as the inspection unit, according to an embodiment of the present invention, includes the first inspection module EM1 and the second inspection module EM2, the coupling state between the first portion CP1 and the second portion CP2, which are respectively coupled to different surfaces of the panel PN, may be easily checked.

Figure 13A:
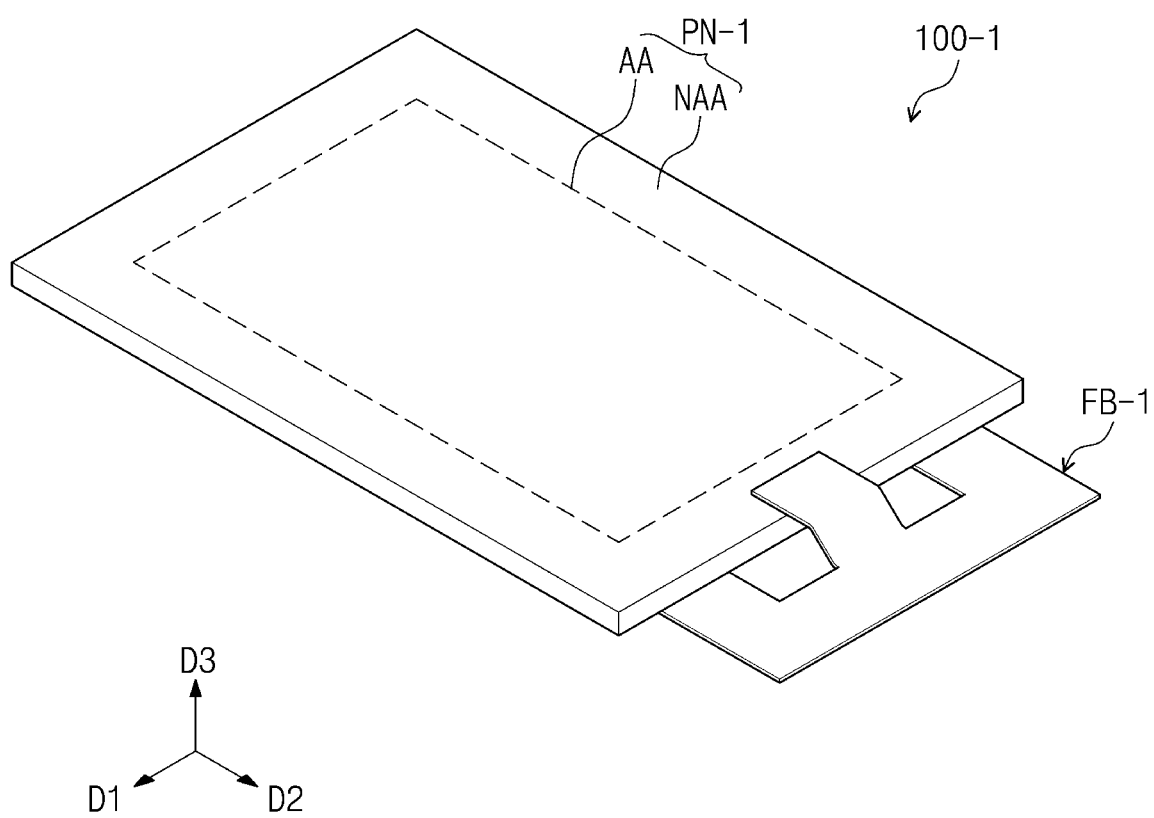
FIG. 13A is a perspective view of an electronic device according to an embodiment of the present invention.
Figure 13B:
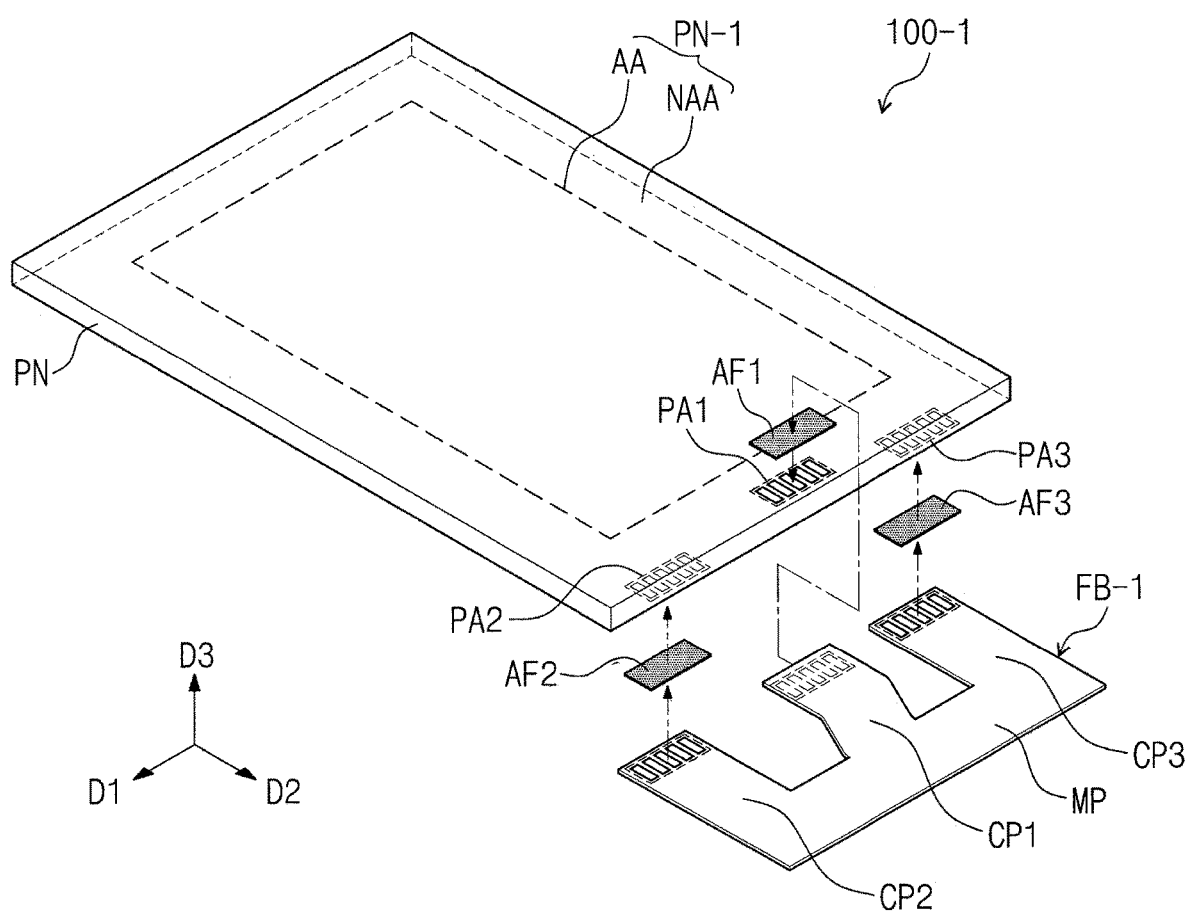
FIG. 13B is an exploded perspective view of the electronic device shown in FIG. 13A.

FIG. 13A is a perspective view of an electronic device according to an embodiment of the present invention, and FIG. 13B is an exploded perspective view of the electronic device shown in FIG. 13A. The electronic device, according to an embodiment of the present invention, will be further described with reference to FIGS. 13A and 13B. The same elements as those described with reference to FIGS. 1-12 are designated by the same reference symbols, and repeated descriptions thereof may be omitted.

An electronic device 100-1 includes a panel PN-1, a circuit board FB-1, a first conductive coupling member AF1, a second conductive coupling member AF2, and a third conductive coupling member AF3. The panel PN-1 may be divided into an active area AA and a peripheral area NAA. The active area AA may be activated (or driven) according to an electric signal and may correspond to the active area of the panel shown in FIG. 1.

The peripheral area NAA may include a first pad area PA1, a second pad area PA2, and a third pad area PA3. The first pad area PA1, the second pad area PA2, and the third pad area PA3 may be arranged along (e.g., may be adjacent to each other in) the first direction D1. In the illustrated embodiment, the second pad area PA2 may be spaced from the third pad area PA3 with the first pad area PA1 therebetween.

The first pad area PA1 is defined on a top surface of the panel PN-1. The first pad area PA1 may correspond to (e.g., may be similar to) the first pad area PA1 shown in FIG. 2, with positions thereof on a plane being slightly different.

The second pad area PA2 is defined on a bottom surface of the panel PN-1. The second pad area PA2 may correspond to (e.g., may be similar to) the second pad area PA2 shown in FIG. 2, with positions thereof on a plane being slightly different.

The third pad area PA3 may be defined on the bottom surface of the panel PN-1. Accordingly, the second pad area PA2 and the third pad area PA3 may be defined on the surface different from that on which the first pad area PA1 is defined.

The circuit board FB-1 includes a first portion CP1, a second portion CP2, and a third portion CP3. Each of the first portion CP1, the second portion CP2, and the third portion CP3 may protrude from a main portion MP toward the panel PN-1. For example, each of the first portion CP1, the second portion CP2, and the third portion CP3 may extend in the second direction D2.

Pads may be disposed on each of the first portion CP1, the second portion CP2, and the third portion CP3. Each of the first portion CP1, the second portion CP2, and the third portion CP3 includes pads respectively corresponding to the first pad area PA1, the second pad area PA2, and the third pad area PA3.

Accordingly, the pads may be provided on a bottom surface of the first portion CP1, and the first portion CP1 may be coupled to the upper surface of the panel PN-1. The first portion CP1 is coupled to the panel PN-1 by the first conductive coupling member AF1 disposed on the first pad area PA1.

The pads may be provided on a top surface of the second portion CP2, and the second portion CP2 may be coupled to the lower surface of the panel PN-1. The second portion CP2 is coupled to the panel PN-1 by the second conductive coupling member AF2 disposed below the second pad area PA2.

The pads may be provided on a top surface of the third portion CP3, and the third portion CP3 may be coupled to the lower surface of the panel PN-1. The third portion CP3 is coupled to the panel PN-1 by the third conductive coupling member AF3 disposed below the third pad area PA3. The circuit board FB-1, according to an embodiment of the present invention, may include the three portions CP1-CP3, and the three portions CP1-CP3 cross above and below the panel PN-1 along the first direction D1 to couple the circuit board FB-1 to the panel PN-1.

Figure 14A:
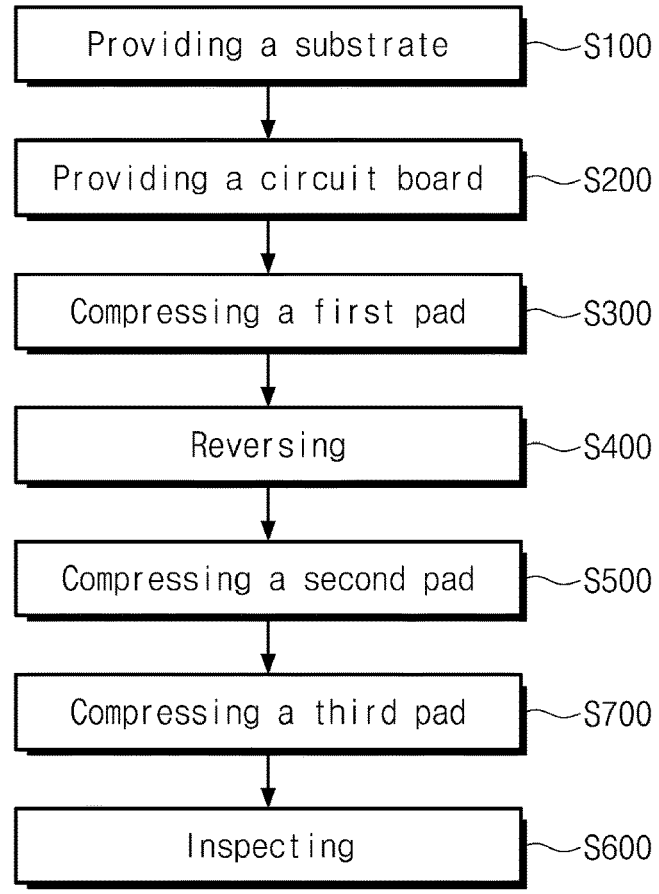
FIG. 14A is a flowchart illustrating a method of manufacturing an electronic device according to an embodiment of the present invention.
Figure 14B:
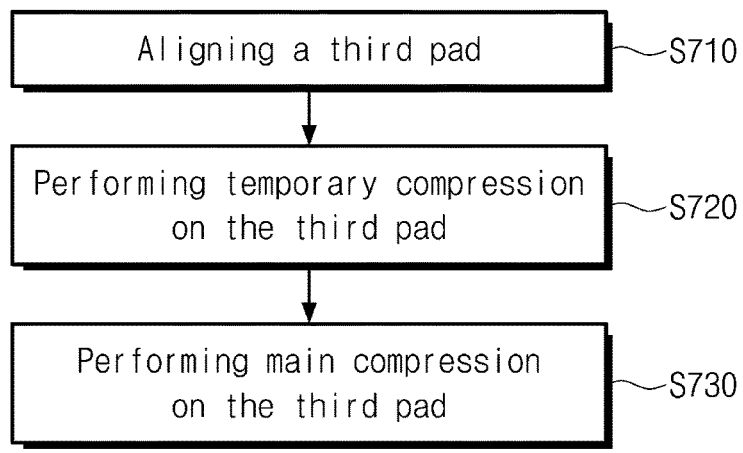
FIG. 14B is a flowchart illustrating a partial process of the method of manufacturing an electronic device illustrated in FIG. 14A.

FIG. 14A is a flowchart illustrating an electronic device manufacturing method according to an embodiment of the present invention, and FIG. 14B is a flowchart illustrating a partial process of the electronic device manufacturing method illustrated in FIG. 14A. Hereinafter, an electronic device manufacturing method according an embodiment of the present invention will be described with reference to FIGS. 14A and 14B. The same elements as those described with respect to FIGS. 1-13B are designated by the same reference symbols, and repeated descriptions thereof may be omitted.

As illustrated in FIG. 14A, an electronic device manufacturing method may further include, with respect to the electronic device manufacturing method illustrated in FIG. 4, a process (S700) of compressing a third pad. Processes other than the process (S700) of compressing the third pad are the same as or substantially the same as those described with reference to FIG. 4 and, therefore, repeated descriptions thereof may be omitted.

Because the electronic device includes the circuit board FB-1, which includes the third portion CP3, and the panel PN-1, which includes the third pad area PA3, the process (S700) of compressing the third pad may be further provided. The process (S700) of compressing the third pad may be performed between the process (S500) of compressing the second pad and the process (S600 in FIG. 4) of inspecting.

As illustrated in FIG. 14B, the process (S700) of compressing the third pad may include a process (S710) of aligning the third pad, a process (S720) of performing temporary compression on the third pad, and a process (S730) of performing main compression on the third pad.

In the process (S710) of aligning the third pad, the third portion CP3 is disposed to face the third pad area PA3 of the panel PN-1. Thereafter, in the process (S720) of performing the temporary compression on the third pad, the third portion CP3 is pressed on the third pad area PA3. During this process, the third conductive coupling member AF3 (refer to FIG. 13B) is phase-changed to allow the third portion CP3 and the panel PN-1 to be physically connected to (e.g., adhered to) each other.

Thereafter, in the process (S730) of performing the main compression on the third pad, a coupling force between the third portion CP3 and the panel PN-1 may increase. The process (S730) of performing the main compression on the third pad may provide pressure and/or temperature (e.g., heat) to the third portion CP3, which is greater than that provided to the third portion CP3 in the process (S720) of performing the temporary compression on the third pad.

Figure 15A:
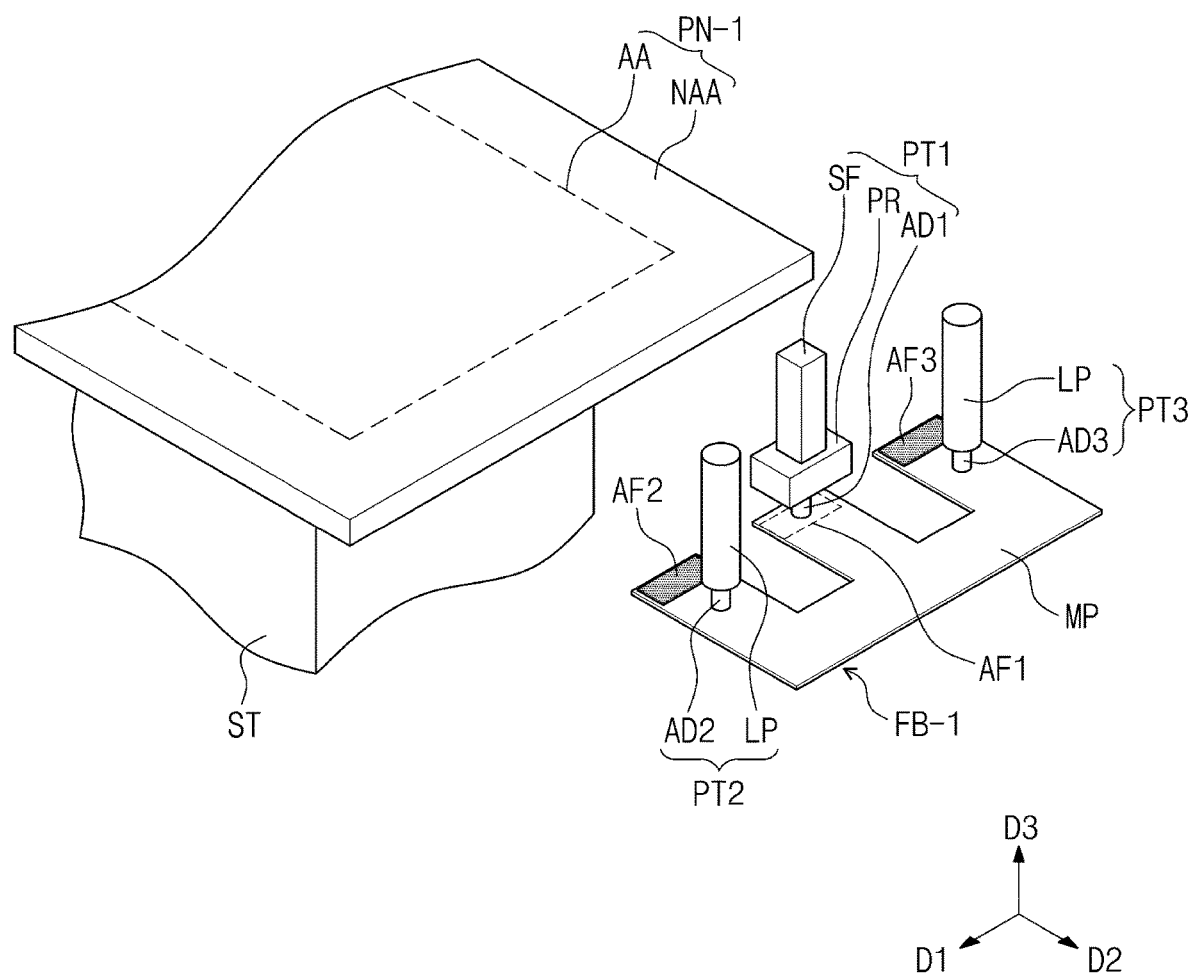
FIG. 15A is a perspective view of electronic device manufacturing equipment according to an embodiment of the present invention.
Figure 15B:
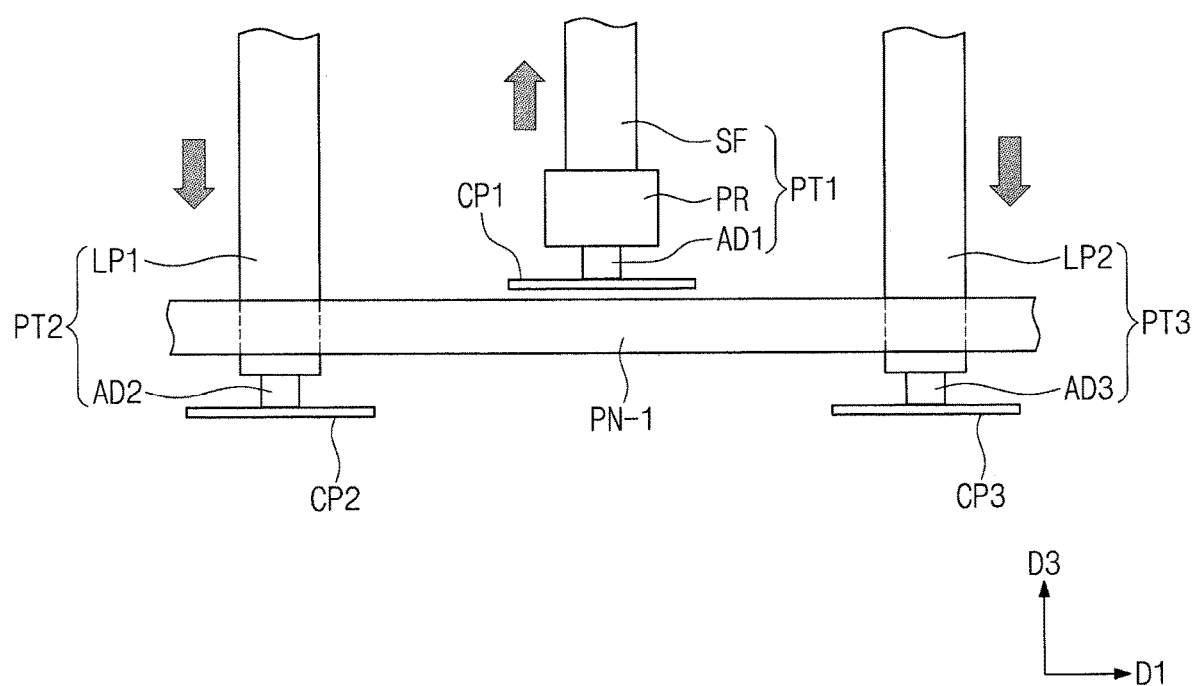
FIG. 15B is a cross-sectional view of the electronic device manufacturing equipment shown in FIG. 15A.

FIG. 15A is a perspective view of electronic device manufacturing equipment according to an embodiment of the present invention, and FIG. 15B is a cross-sectional view of the electronic device manufacturing equipment shown in FIG. 15A.

FIGS. 15A and 15B illustrate electronic device manufacturing equipment including a stage ST and a compression unit. FIGS. 15A and 15B illustrate the compression unit in the process (S300) of compressing the first pad from among the processes illustrated in FIG. 14A. Hereinafter, the electronic device manufacturing equipment according an embodiment of the present invention will be further described with reference to FIGS. 15A and 15B.

As illustrated in FIGS. 15A and 15B, the compression unit may include a fixing and pressing module PT1, a first fixing module PT2, and a second fixing module PT3.

The fixing and pressing module PT1 fixes and presses the first portion CP1. The fixing and pressing module PT1 may include an adherence part AD1, a pressing part PR, and a length part SF. The adherence part AD1 adheres to the first portion CP1 to allow the first portion CP1 to be moved by the fixing and pressing module PT1. The pressing part PR presses the first portion CP1 on the first pad area PA1. The length part SF controls vertical movement of the fixing and pressing module PT1. The fixing and pressing module PT1 may correspond to the fixing and pressing module shown in FIG. 6 and, thus, a repeated description thereof may be omitted.

The first fixing module PT2 fixes the second portion CP2. The first fixing module PT2 adheres to a top surface of the second portion CP2 to allow the second portion CP2 to be moved by movement of the first fixing module PT2. The first fixing module PT2 may correspond to the fixing module shown in FIG. 6 and, thus, a repeated description thereof may be omitted.

The compression unit, according to an embodiment of the present invention, may further include the second fixing module PT3, different from the embodiment shown in FIG. 6. The second fixing module PT3 fixes the third portion CP3. The second fixing module PT3 adheres to a top surface of the third portion CP3 to allow the third portion CP3 to be moved by movement of the second fixing module PT3. The second fixing module PT3 may include an adherence part AD3 configured to adhere to the third portion CP3 and a length part LP connecting the adherence part AD3 to the main body. The second fixing module PT3 may substantially correspond to (e.g., may be substantially similar to) the first fixing module PT2.

As illustrated in FIG. 15B, in the process of aligning the circuit board, the first portion CP1 is aligned to be disposed above the panel PN-1 and the second portion CP2 and the third portion CP3 are aligned to be disposed below the panel PN-1. The fixing and pressing module PT1 may be moved relatively upwardly to dispose the first portion CP1 above the panel PN-1, and each of the first fixing module PT2 and the second fixing module PT3 may be moved relatively downwardly to dispose the second portion CP2 and the third portion CP3 below the panel PN-1.

As the electronic device manufacturing equipment, according to an embodiment of the present invention, includes the fixing and pressing module PT1, the first fixing module PT2, and the second fixing module PT3, which are independently controllable, the electronic device manufacturing equipment may easily align a plurality of portions of the circuit board FB-1, which are respectively coupled to different surfaces of the panel PN-1.

According to embodiments of the present invention, because the circuit board is fixed and aligned by using different methods depending on the surface on which the pads are to be disposed, the circuit board may not be damaged, and the pressing tool and the fixing tool may not interfere with each other.

Although exemplary embodiments of the present invention have been described, it is understood that the present invention should not be limited to these exemplary embodiments and that various changes and modifications can be made by one ordinary skilled in the art within the spirit and scope of the present invention.

Hence, the scope of the present invention shall be determined at least by the technical scope of the accompanying claims and their equivalents.

What is claimed is:

1. A method of manufacturing an electronic device comprising a panel and a circuit board, the panel having an active area, a first pad area adjacent to the active area, and a second pad area adjacent to the active area, the circuit board comprising a main portion, a first portion connected to the main portion and comprising first pads on one side of the circuit board, and a second portion connected to the main portion, spaced from the first portion on a plane, and comprising second pads on another side of the circuit board, the method comprising:

placing the panel on a stage;

aligning the circuit board with the panel such that a lower surface of the first portion of the circuit board is over and faces an upper surface of the panel and the first pads of the circuit board face the first pad area and an upper surface of the second portion of the circuit board is below and faces a lower surface of the panel and the second pads of the circuit board face the second pad area;

moving the first portion of the circuit board by contacting an upper surface of the first portion;

moving the second portion of the circuit board by contacting the upper surface of the second portion;

supporting the second portion of the circuit board by contacting the lower surface of the second portion; and compressing the first portion of the circuit board to the first pad area of the panel.

2. The method of claim 1, wherein the aligning of the circuit board comprises moving the panel horizontally via the stage.

3. The method of claim 1, wherein the circuit board further comprises a third portion spaced from the second portion with the first portion between the second and third portions, wherein the third portion comprises third pads on the other side of the circuit board and separate from the first pads and the second pads, and wherein the aligning of the circuit board comprises concurrently aligning the first portion, the second portion, and third portion via external contact to the first portion on the one side of the circuit board, to the second portion on the one side of the circuit board, and to the third portion on the one side of the circuit board.

4. The method of claim 3, wherein the panel further comprises a third pad area adjacent to the active area and spaced from the first pad area and the second pad area, and wherein the aligning of the circuit board further comprises aligning the third portion of the circuit board under the lower surface of the panel.

5. The method of claim 1, further comprising:

reversing the panel about 180° about a rotational axis such that the second pad area faces upward, the rotational axis having an extension direction crossing a direction along which the first pad area and the second pad area are arranged;

aligning the second portion of the circuit board with the second pad area of the panel; and compressing the second portion to the second pad area.

6. The method of claim 5, wherein the aligning of the second portion of the circuit board comprises moving the stage on which the panel is arranged in a direction parallel to the extension direction of the rotational axis.

7. The method of claim 5, wherein the aligning of the second portion of the circuit board comprises vertically and horizontally moving the second portion via a clamp.

8. The method of claim 7, wherein the compressing of the second portion to the second pad area is performed while the second portion is fixed by the clamp.

9. The method of claim 8, wherein the aligning of the second portion of the circuit board is performed while the first portion is attached to the first pad area.

10. The method of claim 1, wherein the compressing of the first portion to the first pad area comprises:

performing temporary compression such that the first portion is temporarily compressed to the first pad area; and performing main compression such that the first portion is compressed to the first pad area at a temperature and a pressure higher than those in the performing of the temporary compression.

11. The method of claim 10, further comprising moving the stage after the performing of the temporary compression and before the performing of the main compression.

12. The method of claim 11, wherein the moving of the stage occurs after the performing the temporarily compression of the first portion to the first pad area and before the performing of the main compression.

* * * * *